(12) United States Patent
Lin et al.

(10) Patent No.: US 8,847,615 B2
(45) Date of Patent: Sep. 30, 2014

(54) METHOD, APPARATUS AND SYSTEM OF PARALLEL IC TEST

(75) Inventors: Kenneth ChengHao Lin, Shanghai (CN); Hongxi Geng, Shanghai (CN); Haoqi Ren, Shanghai (CN); Bingchun Zhang, Shanghai (CN); Changchun Zhen, Shanghai (CN)

(73) Assignee: Shanghai Xinhao (Bravechips) Micro Electronics Co. Ltd., Shanghai (CN)

( * ) Notice: Subject to any disclaimer, the term of this patent is extended or adjusted under 35 U.S.C. 154(b) by 1127 days.

(21) Appl. No.: 12/659,768

(22) Filed: Mar. 19, 2010

(65) Prior Publication Data

US 2010/0237891 A1     Sep. 23, 2010

(30) Foreign Application Priority Data

Mar. 20, 2009   (TW) .............................. 98109078 A

(51) Int. Cl.
    *G01R 31/3187*     (2006.01)

(52) U.S. Cl.
    USPC ............... 324/750.3; 324/762.01; 324/762.05

(58) Field of Classification Search
    USPC ....................................... 324/750.3
    See application file for complete search history.

(56) References Cited

U.S. PATENT DOCUMENTS

| | | | | |
|---|---|---|---|---|
| 5,059,899 | A * | 10/1991 | Farnworth et al. | ............... 438/18 |
| 6,856,158 | B2 * | 2/2005 | Frame et al. | ............... 324/762.01 |
| 6,930,504 | B2 * | 8/2005 | Ishibashi | ..................... 324/750.3 |
| 6,954,079 | B2 * | 10/2005 | Sugimoto et al. | ........ 324/762.01 |
| 6,967,110 | B2 * | 11/2005 | Guldi et al. | ..................... 438/11 |
| 7,242,208 | B2 * | 7/2007 | Ma et al. | ................... 324/762.03 |
| 7,466,157 | B2 * | 12/2008 | Miller | ........................ 324/750.3 |
| 7,782,074 | B2 * | 8/2010 | Kerber | ..................... 324/762.03 |

* cited by examiner

*Primary Examiner* — Richard Isla Rodas
(74) *Attorney, Agent, or Firm* — Finnegan, Henderson, Farabow, Garrett & Dunner, LLP

(57) ABSTRACT

A method, apparatus and system for integrated circuit testing, wherein a plural number of devices under test (DUTs) and a plural number of comparison apparatuses are placed on a common substrate. The DUTs all operate under the same input stimulation and each produce its own operation output. The outputs are compared by the comparison apparatuses to generate comparison characteristics which are used to filter-out the failed devices. This invention lowers the testing cost, shortens time to product mass-production, and lowers the miss rate of failed devices passed as good ones.

24 Claims, 28 Drawing Sheets

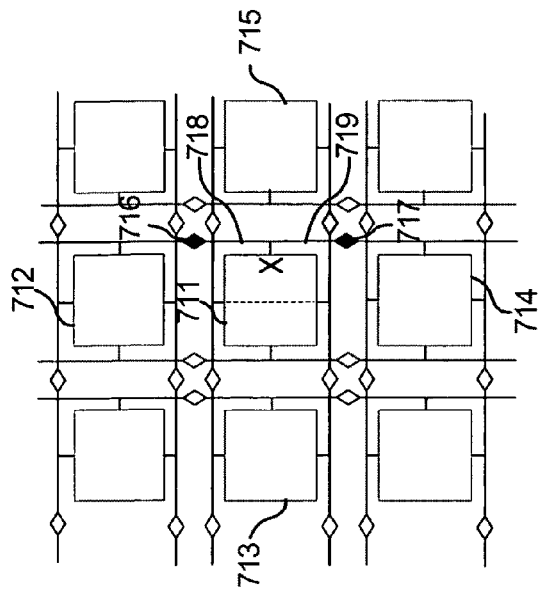
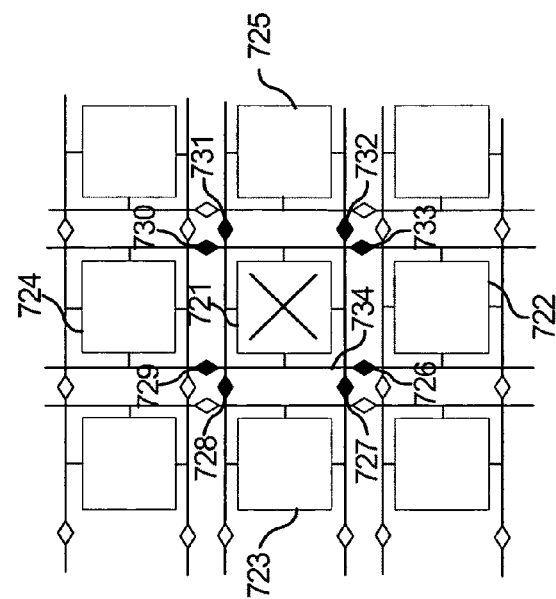
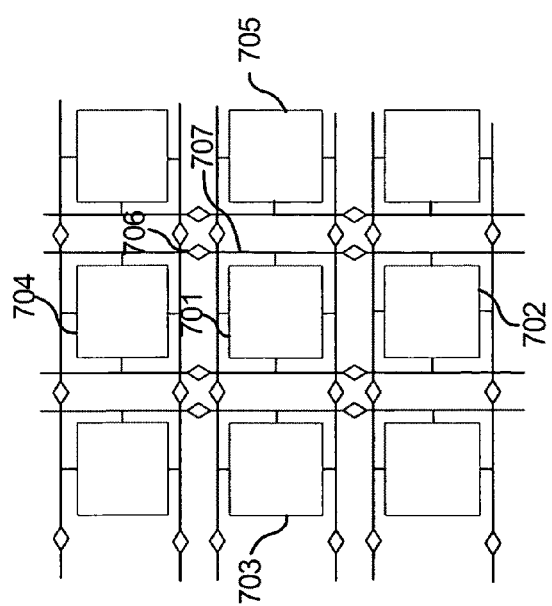

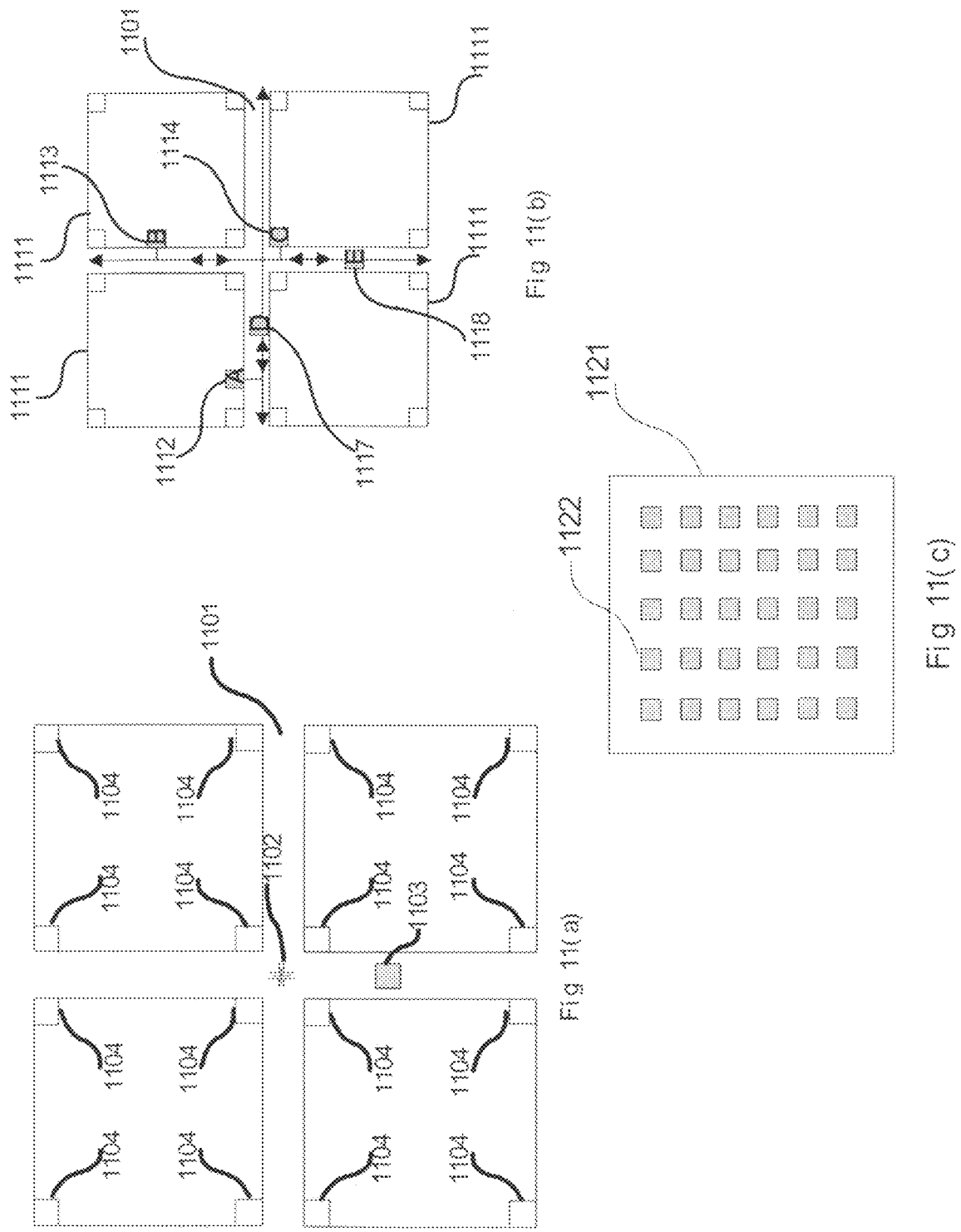

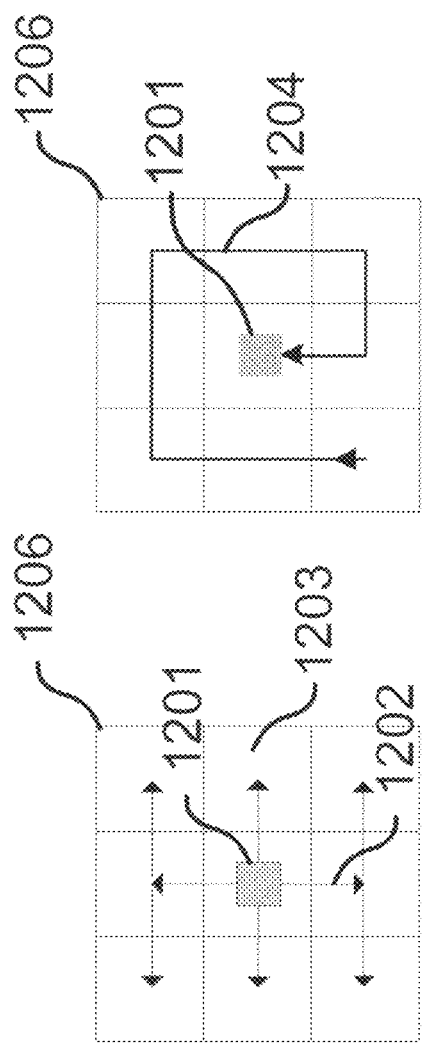

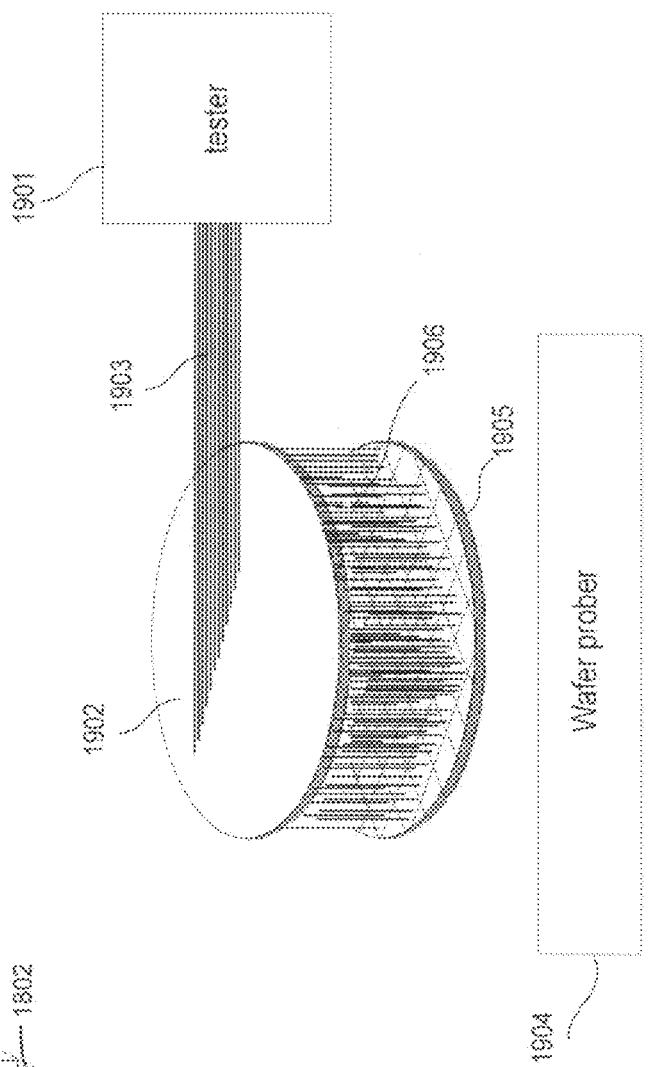
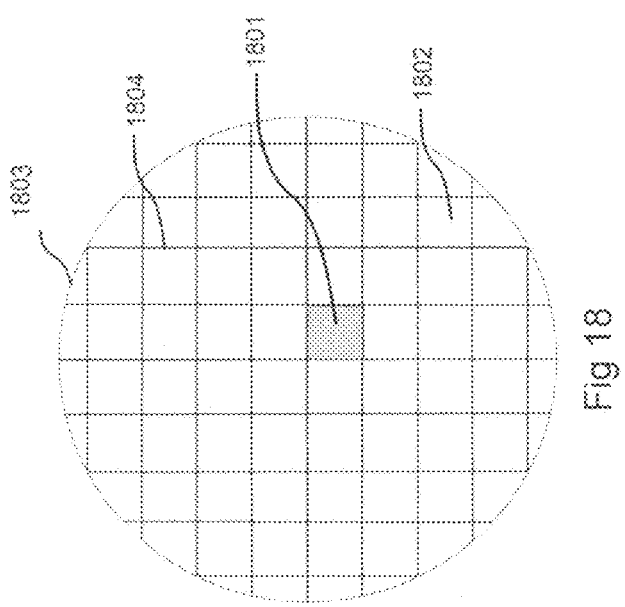

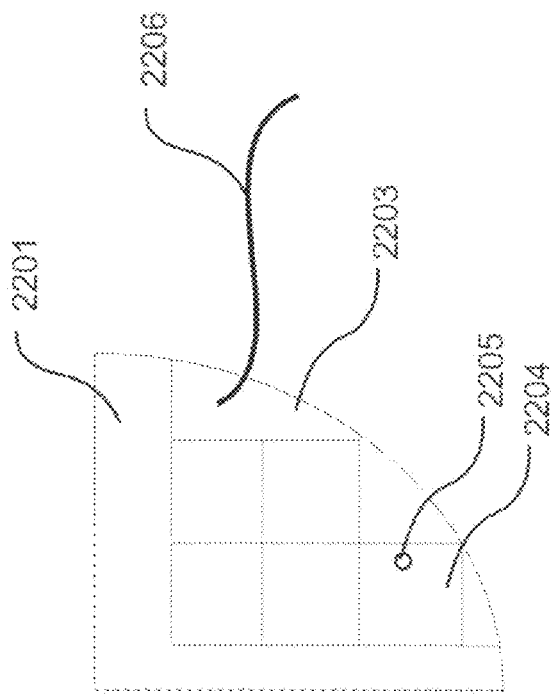
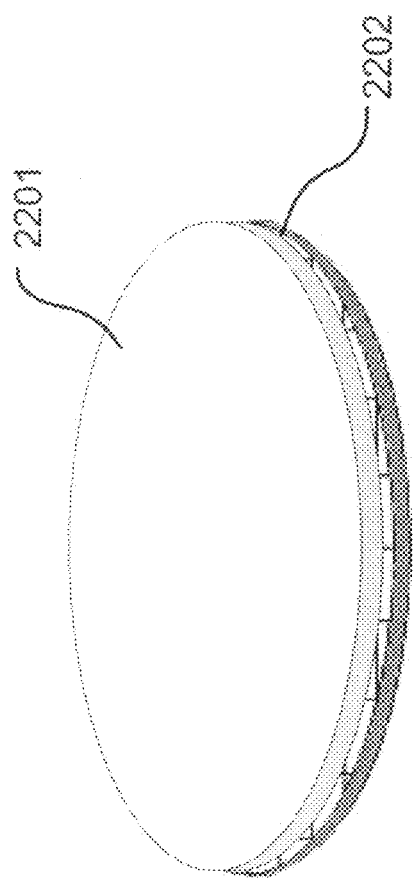
Fig 22 (a)
Fig 22 (b)

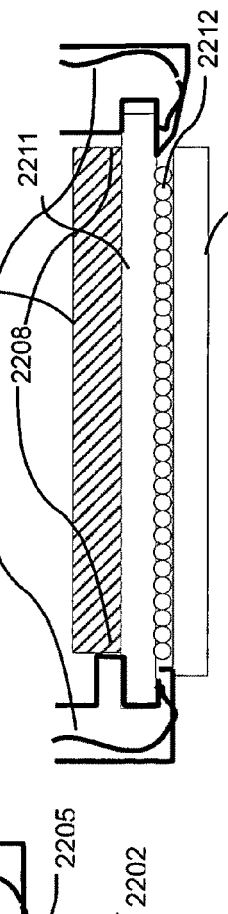
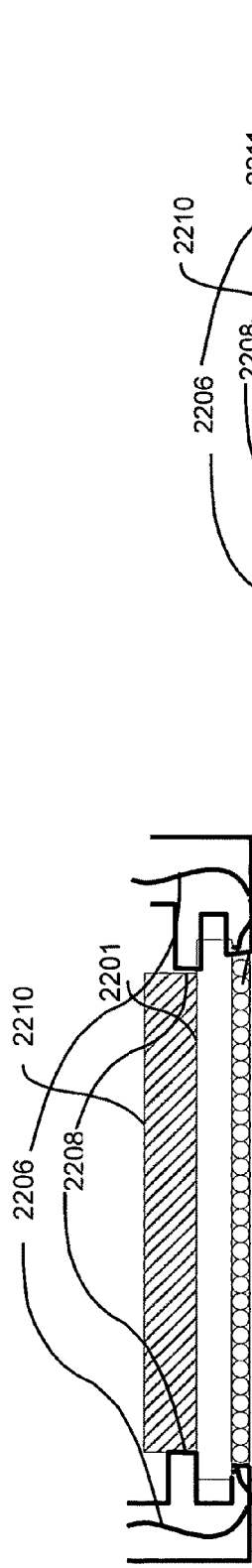
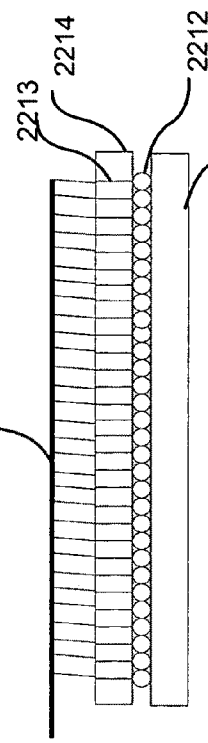
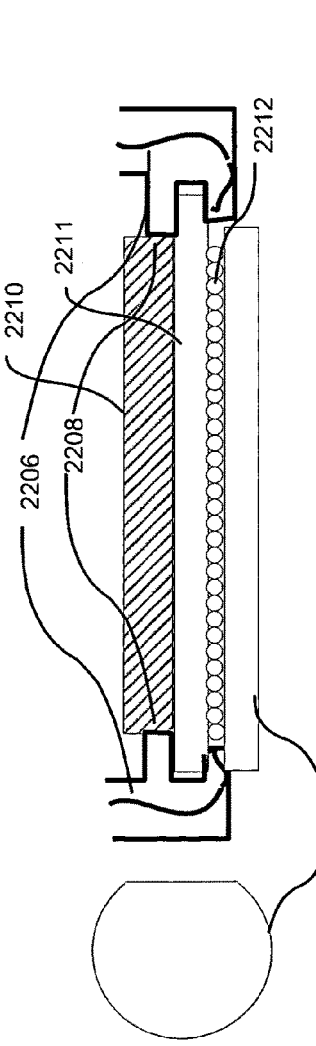

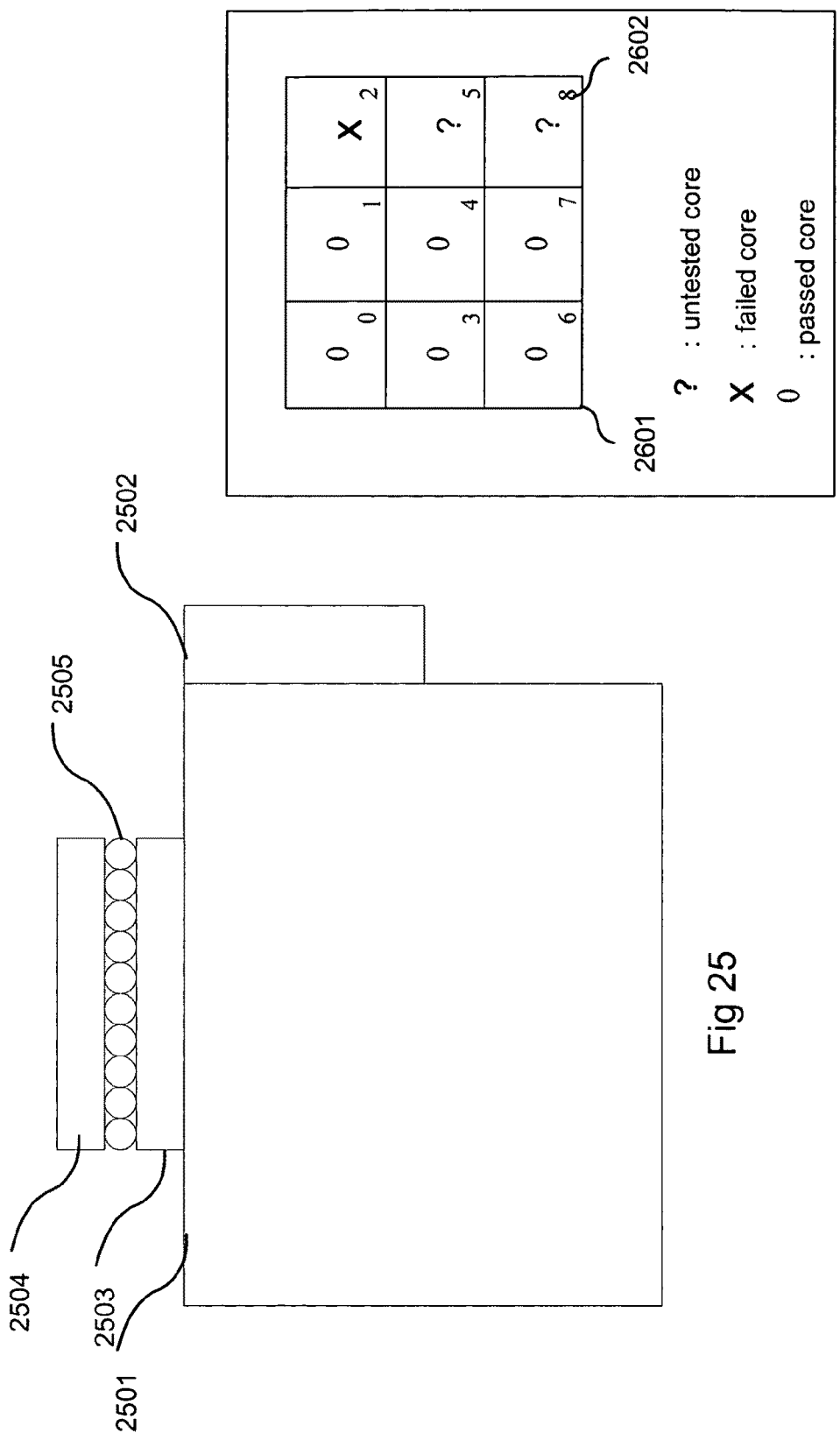

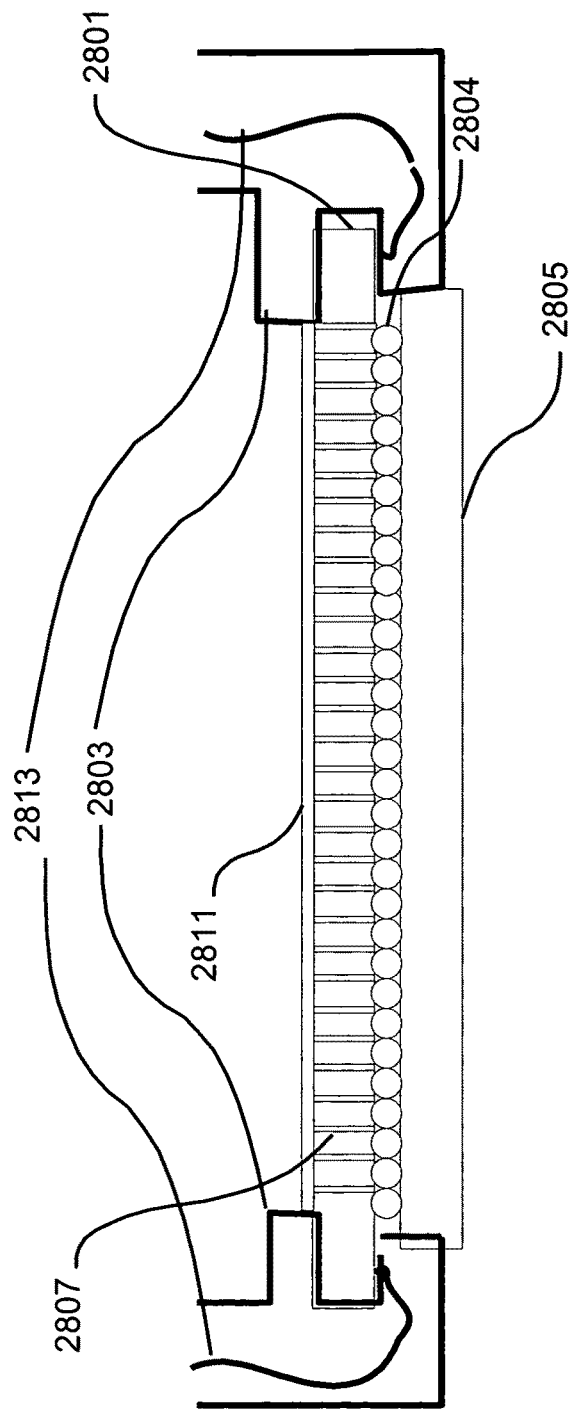

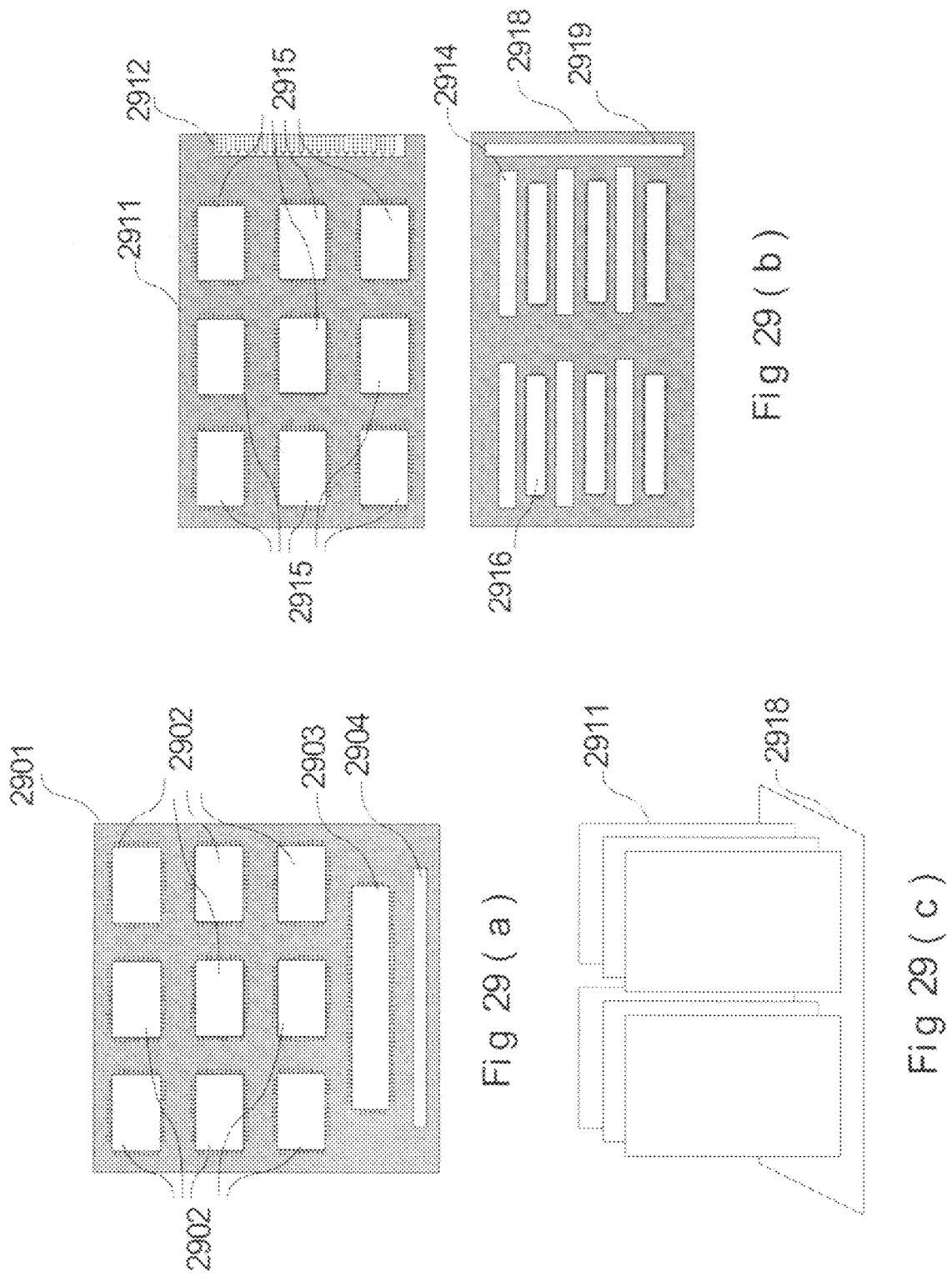

METHOD, APPARATUS AND SYSTEM OF PARALLEL IC TEST

DESCRIPTION OF THE INVENTION

1. Field of the Invention

The present invention is in the area of the integrated circuit, and pertains in particular to a parallel testing method, apparatus and system for integrated circuits.

2. Background of the Invention

In a typical semiconductor manufacturing process a plural number of identical rectangular-shaped integrated circuit dice are fabricated on a thin and uniform wafer of semiconductor material. These said dice on the wafer are separated by scribe lines 60 to 80 microns wide. Often the photo mask alignment mark and wafer acceptance test devices (WAT) are placed in the scribe lines.

During the fabrication process the photo lithography machine exposes one stepper field at a time; each stepper field contains a singular or a plural number of dice. Each said die on the wafer is tested after all manufacture steps are completed. The wafer prober contacts the pads of the dice under test through a probe card, delivering testing stimulation based on testing programs to the dice. The result output of the dice in response to the inputs is sent to the tester to be compared with the expected results. Dice are marked functional correct if the comparison matches. One die is tested at a time.

Location of dice passed and failed the test are ink marked or stored in a file call wafer map in preparation for subsequent chip packaging. The wafer is cut along scribe lines to separate the dice after all tests are completed. The dice that pass the test are packaged into chips while the dice that do not pass are discarded. The packaged chips are normally tested again and functional chips are delivered to customers.

FIG. 1 shows the common wafer test process, wafer under test 101 is placed on the wafer prober 102, the tester 103 sends test stimulation produced by test vector generator 104 through cable 105 to test head 106 mounted probe card 107, to a die under test 108. The output of the die under test is then picked up by probe card 107, sent through test head 106, output cable 111, to tester 103 and compared with the expected results in comparator 109, to determine the functionality of the die.

As the integrated circuit manufacture process improves, the wafer size has been increased from 1 inch to 12 inches. Nowadays one wafer can contain up to ten thousand dice. However, the wafer test process is still serial, one die at a time due to the limitation of expensive testing channels. The testing time is directly proportional to the total number of dice on the wafer. The long testing time results in a high testing cost. Each time the probe moves from one die to another die it takes 100 ms~250 ms, this time is wasted because no test is performed during the move. This further increases the total testing time and the testing cost. The cost of testing and packaging is normally 25%~30% of the total integrated circuit manufacturing cost. Today the costs can be as high as 50%.

Besides this, the testing can only be performed at a low frequency due to a long connection delay between the tester and the die under test.

Multi-site testing is one attempt to solve this problem by parallel testing. This solution is restricted by the number of available testing channels which typically numbers from 128 to 1024 for each tester. Dice under test today normally have hundreds of pads which limit the multi-site testing to typically 2 die to 4 dice at a time. The cost of testing channel is high; increasing the number of channels raises the testing equipment cost, so the overall testing cost does not lower by much.

Another solution is to perform die self test on wafer. The next three patents are related to this idea, but different from the present invention.

CN Pat. No. 200510008164.X "Wafer with built-in burn-in and electrical parameter testing and its implementation method." describes a method to do burn-in and electrical parameter testing on dice on a wafer in parallel. This method has a burn-in test generation circuit on the wafer, which generates toggling, functioning meaningless stimulation inputs to dice to perform a burn-in and electrical test on the wafer in parallel. Testing results are not sent out to testers.

CN Pat. No. 200410046002.0 "Semiconductor with testing circuit and manufacturing method" describes a method to measure the voltage on the dice precisely. This method puts testing circuits on the scribe lines presenting high impedance to the dice under test and low impedance to the probe, so the voltages on all the pads can be measured by the probe accurately.

CN Pat. No. 86105604 "Circuit structure for testing integrated circuit components" describes a testing circuit structure based on the circuit components in the wafer.

As afore described, present integrated circuit testing method, apparatus and system can only test one or several device under test (DUT) at a time due to the limit of number of testing channels. Large scale simultaneous/parallel comparison is not possible. The limit on numbers of test channel is the bottleneck of test efficiency improvement.

SUMMARY OF THE INVENTION

The present invention discloses method, apparatus and system for testing a plural number of microelectronic circuits of identical functionality on a common substrate in parallel. The common substrate contains a plural number of devices under test (DUT) all under the same testing stimulation. Outputs of the plural number of DUTs are compared with expected result or are compared with corresponding outputs of each other by the comparing apparatus to identify the flawed devices. The present invention enables parallel testing for thousands of DUTs with a near no increasing of testing channels.

The present invention discloses an integrated circuit testing method for parallel testing of a plural number of functional identical microelectronic circuits on a common substrate; the substrate can be a wafer, a packaged integrated circuit, or a circuit board; the method includes:

(a) deliver the same stimulation to a plural number of functional identical devices under test (DUTs) on the substrate through input distribution paths;

(b) compare the corresponding outputs of the DUTs in parallel using a plural number of comparison apparatuses;

(c) read out the comparison results and location information through output paths;

(d) classify DUTs based on the read out comparison results and location information. DUTs with comparison results equal/matching belong to the good unit group, units with comparison results unequal/un-matching belong to the suspected-flawed unit group.

The present invention discloses another integrated circuit testing method for parallel testing of a plural number of functional identical microelectronic circuits on a common substrate; the substrate can be a wafer, a packaged integrated circuit, or a circuit board; the method includes:

(a) deliver the same stimulation to a plural number of functional identical devices under test (DUTs) on the substrate through input distribution paths;

(b) compare the outputs of the DUTs in parallel with corresponding expected results which also come in from the input path by a plural number of comparison apparatuses;

(c) read out the comparison results and location information through output paths;

(d) classify DUTs based on the read out comparison results and location information. DUTs with comparison results equal/matching belong to the good unit group; units with comparison results unequal/un-matching belong to the flawed unit group.

The present invention discloses a wafer containing a plural number of functional identical dice, the dice or functional modules with identical function in the dice are the units under test; the wafer also contains a plural number of assistant testing apparatuses; the assistant testing apparatuses can be partially located in the DUTs, or be entirely located outside the DUTs include:

(a) power supply circuit, which connects the power supply ports of the assistant testing apparatuses;

(b) input paths connecting to input ports of a plural number of DUTs; the input paths are also used to send expected results to one input port of the comparison apparatus when using the expected results method;

(c) comparison apparatus. One input port of the comparison apparatus is connected to the output port of a DUT; the other input port of the comparison apparatus is either connected to the corresponding output port of another DUT, or is connected to input path carrying expected result;

(d) registers, which connect to the output port of the comparison apparatus and the output path, for storing output result of comparison apparatus;

(e) output paths, which connect to a plural number of register circuits, reads out corresponding results of comparison apparatus and the location information of corresponding DUTs.

The testing assistant apparatus can be disabled in normal working mode if it is located inside the DUT. If the assistant testing apparatus is located outside of the DUTs, the electric connection between the assistant testing apparatus and the DUT should be completely cut off after the wafer sawing.

The extra testing pads needed for testing can be placed inside the dice or be placed in the position of the corner pads or non-connection (NC) pads of the dice or in the scribe lines. During testing, the probe connects to the normal pads and the extra testing pads of a single or a plural number of dice on the wafer, input paths pass power and testing signals to all or selected part of dice on the wafer.

The DUTs on the wafer can also get power supply wirelessly using electromagnetic waves.

The power supply circuit on the wafer can also connect to the power pads of a plural number of units under test.

The power supply circuit on the wafer can be entirely made of fixed wire connection, or entirely of configurable switch path or a combination of fixed wire connection and configurable switch path.

The input path on the wafer can be entirely made of wired connection, or entirely of electro-magnetic wave wirelessly or a combination of wired connection and electro-magnetic wave.

The input path on the wafer connecting the DUTS and the comparison apparatus can be entirely made of fixed wire connection, or entirely of configurable switch path or a combination of fixed wire connection and configurable switch path.

The input path on the wafer can is further comprised of conversion apparatus connecting to the DUTS. The conversing apparatus include but are not limited to digital to analog converter or analog to digital converter.

External apparatus can reconfigure the wired configurable switch paths on the wafer by transmitting configurable setting in parallel or in series through the paths. The switches corresponds to the inputs of DUTs are configured as ON while the switches corresponds to the outputs of the DUTS are configured as OFF in case of importing input stimulation or configuration settings or expected results. A plural number of DUTs on the wafer can be driven by the same input stimulation when the input paths are properly configured. The configuration of an input path network which passes the same input stimulation to all DUTs is achieved by configuring the switches leading away from the stimulation source ON and the switches leading toward the stimulation source OFF.

In one embodiment the wired configurable switch paths are made of buffers, which can be switched off, between the corresponding input ports of said DUTs. A plural number of DUTs on the wafer can be driven by the same input stimulation when the input paths are properly configured. The configuration is achieved by configuring the switch-able buffer leading away from the stimulation source ON and the switch-able buffer leading toward the stimulation source OFF.

The comparison apparatus on the wafer is used to sample all the output signals of a plural number of units under test and compare them in parallel with expected results inputted through the input paths or compare the sampled output signals with each other.

The comparison apparatus on wafer may also have conversion apparatus connected with said DUTs converting output signals of said DUTs before comparison.

The comparison apparatus on wafer may also have result compression apparatus used for accumulating and compressing comparison results in time and in space. Accumulating in time means the comparison apparatus may include accumulate circuitry connected to the DUTs, for accumulating and registering the output result of comparison apparatus. Compressing in space means the combination of a plural number of neighboring comparison results of the same into one result.

The comparison apparatus for parallel testing DUTs on the wafer sample the output signals from the output ports of the DUTs, convert and compare those signals with expected results or compare those signals with corresponding signals of other DUTs; all input ports receive the identical stimulation. The output signals can be signals from the output ports or internal signals of the DUTs. The sample can be signals in any form, including but not limited to digital signal or analog signal. The conversion includes but is not limited to analog to digital conversion or digital to analog conversion of current, voltage and impedance. The comparison can be compared in parallel between operation results of units under test and expected results transmitted in or compared in parallel of operation results of one DUTs to another.

A singular number or a plural number of output signals of a singular or a plural number of DUTs can be sampled and judged to prevent false reporting of comparison result, for example, the comparing result reports a match while the DUTs are not functioning due to power supply problems. The singular number or plural number of output signals can be singular number or plural number of digital output bits or singular number or plural number of analog output ports. The plural number of output bits or output ports can be from different DUTs. The sampling and judging can be performed entirely on the wafer based on the singular or plural number of output signals or an external apparatus judges on the singular or plural number of operation results sampled on the wafer. The functional module performs the judgment includes but not limited to counter. The judging method includes but is not limited to examining whether the signal toggle times recorded by the counter matches with expected.

One embodiment is that one bit signal of the microprocessor data output bus is sampled and recorded by the counter. The counter was initially set to zero, and the counter samples the logic value of this signal every clock cycle after the microprocessor begins to run a test pattern. The count of the counter is incremented by one every time the sampled signal is a logical high. The test result is valid if the count matches with the expected when test is complete. The test result is invalid or the unit under test is bad if the count does not match the expected.

Take the DC characteristic testing on the unit under test as an example, the DC characteristic value taken from the test can be compared to determine if it meets the requirement. The comparison includes but not limited to the comparison with expected DC characteristic value or comparison between the DC characteristic values of the plural number of units under test.

The comparison apparatus can have the sampling and comparison functions only or sampling, conversion and comparison functions combine together. The comparison apparatus can sample the operation results first, and then perform comparison on the samples, or compare with the running results first, and then samples the compare results as the final results.

The comparison apparatus can also have functioning pass/fail judgment function. In the case of comparing with the expected results, the DUT is judged functioning if its output signals are equal/matching to the expected results; the DUT is judged failed if the output signals aren't equal/matching to the expected results. In the case of DUTs comparing with each other, output signals of a DUT are compared with the corresponding output signals of the neighboring DUTs, the DUT is judged functioning if its output signals are equal/matching to the corresponding output signals of other DUTs; the DUT is judged possibly failed if the output signals aren't equal/matching to the corresponding output signals of other DUTs. Further judgment by simple rule can be performed on possibly failed DUTs either on or off said wafer containing said DUTs. Conventional single die test can be further performed on possibly failed units to determine if it really is failed because the number of passed DUTs is more than the number of failed DUTs.

The input path on the wafer to a port of a die has to be set high impedance if the port is bi-directional input/output port and if the port is in output mode. The bi-directional input and test/output port which the probe pin landed on can have an extra output port for testing the bi-directional port. Both of the bi-directional input and test/output port and the extra output port are connected to the comparison apparatus.

The output path on the wafer can be entirely made of fixed wire connection, or entirely of configurable switch path or a combination of fixed wire connection and configurable switch path.

The tester can read out a wafer map containing the result of comparison apparatus and die position information of the plural number of said DUTs on said wafer through the output path and through the probe card. The output path can be configurable or fix wired. Each output path connects a single or a plural number of comparison apparatus if the output path is configurable. Multiple output paths can be connected together as a single output path when the switch between the paths are turned ON and can be treated as a number of separate paths if the switch between the paths are turned OFF. A switch is not needed if the output paths are made of fixed wires.

The read out method from the output circuit includes but not limited to serial output of single output path, parallel output of a plural number of output paths picked up by a plural number of probes or a mixture of both methods. In the case of a single output path only one set of probe pins is needed. In the case of plural number of output paths, a plural set of probe pins pick up a plural number of read out information in parallel or a single or a plural number set of probe pins take turns picking up comparison results.

The read out information of the output path can be the judgment on whether the DUTs are defective, or simply the comparison results from the comparison apparatus corresponding to the output ports of the DUTs.

The input path and said output path for parallel testing the DUTs on the wafer can be set up through inputting all configuration information in series in one shot, or through inputting the configuration information one step at a time. The input path can then pass the input stimulation and the expected result from the DUT contacted by the probe pins to all other units. The output path can then pass all the test results of all other said units under test to the DUT contacted by the probe. The design of said input and output path has a higher reliability than the design of the DUTS. It may also be capable of performing self tests after the input and output paths are configured to ensure functionality of the paths. If this pre-test fails, the probe can be moved to another DUT rebuilding new input and output paths, and the self test is performed again. For example, self test stimulation can be applied to each DUTs through the input path, and then be read out through the output path in series to self test the input and output paths.

The input path for parallel testing can be placed on the wafer containing the dice. The placement of the input paths on the wafer includes but is not limited to within the DUTs, partially in the dice or outside the dice. The wires that are part of input and output paths can be placed in scribe line, within the dice or through the dice. The wires and apparatus in scribe line will be cut during wafer sawing with no effect on the normal function of the dice. The test pads in corner pad or non-connecting pad position has no effect on the function of the dice either. The test assisting apparatus can be placed within the dice or in the scribe line sharing space with wafer acceptance test (WAT) structure or even on another wafer. The sharing can be design structure of this invention around the WAT test structure or share part of the WAT test structure, such as the probing pads of the WAT test structure for simulation input.

Capacitors can also be put in the scribe line to simulate output load the die under test needs to drive, to make the test more accurately.

The test assisting apparatus can be generated automatically based on a few basic cells using computer aided place and route tool.

The test systems of today are not capable in delivering high power supply currents needed for high frequency, large scale common substrate IC parallel testing. One solution is to perform a plural number of test passes in the common substrate IC parallel testing. Wherein the first pass is a low speed functioning test, employing long and complete functioning test vectors, applied on a large amount of DUTs. The later test passes are high frequency speed test, employing short critical path specific test vectors, applied to one zone of smaller amount of DUTS at time. Another solution is to use the integrated circuit test system described below.

The invention discloses a new type of parallel integrated circuit testing system which includes the wafer under test, the probe card and the tester; the wafer under test can contain all or parts of assistance test apparatus that are fabricated with the semiconductor manufacturing process. The probe card can include another substrate which contains part or all of assistant test apparatus. The tester has a plural number of power supplies and the corresponding current limiters, it can provide enough current to all DUTs on the wafer at the same time to guaranty the DUTs can work at the desired frequency, it can also cut off a said power supply to certain DUTs if the corresponding DUT or DUTs are short circuited.

The testing system can perform self test to correct errors in assistant testing apparatus itself, establish input and output path on the wafer, keep or rebuild the input and output path based on the self test results on input and output path.

The assistant testing apparatus of the system includes:
(a) a power supply circuit, which is connected to power supply ports of the assistant testing apparatuses;
(b) input paths connecting to input ports of a plurality of DUTs; the input paths are also used to send expected results to input ports of comparison apparatus when using the expected results method;
(c) a plurality of comparison apparatus each including an input port connected to an output port of a DUT, and another input port either connected to the corresponding output port of another DUT, or connected to an input path for receiving expected result;
(d) a plurality of registers, which are connected to output ports of the plurality of comparison apparatus for storing output results of comparison apparatus;
(e) output paths, which are connected to the plurality of register circuits for reading corresponding results of comparison apparatus and the location information of corresponding DUTs.

In the system of this invention, the electric connection between the testing assistance apparatus outside the die under test and the die is cut off completely after wafer sawing.

The unit under test of the system can get power supply wirelessly through electromagnetic waves.

The power supply circuit of the system can also connect to the power input ports of a plural number of units under test.

The power supply of die in the system can be composed of fixed wire connection or configurable switch path or a combination of the two.

The input path of the testing assistant apparatus can transmit the data and control signals to a plural number of units under test using wired electric connection or electromagnetic waves or a combination of wired electric connection and electromagnetic waves.

The input path can also consist of conversion apparatuses for converting input signal to input port.

The comparison apparatus in the testing assistant apparatus is used for sampling the output signals of a plural number of units and doing parallel comparison with the corresponding expected results inputted through the input path, or sampling the output signals of the plural number of units and doing comparison between the corresponding output signals of different units.

The comparison apparatus in the testing assistant apparatus can also include result collection and compression apparatus for collecting and compressing compare results from the aspect of time and space.

If the port of the unit under test on the wafer is used as bi-directional input and test/output port, the corresponding input path connected to the port is configured to be high impedance when the port is used as output port.

The output circuit of the testing assistant apparatus can be composed of a fixed wire connection, a configurable switch path, or a combination of a fixed wire connection and a configurable switch path.

The other substrate of the probe card in the system includes but not limited to the wafer or PCB board, it can support power and test stimulation to the power ports and signal input ports of all or part of the units under test.

The probe card of the system in this invention connects with the die under test through bump; the bump can be located on the probe card or on the wafer under test or both. The other port of another substrate connects to the tester.

For example, solder ball on wafer under test can be used as probe, another wafer or circuit board is pressed on the wafer to do parallel testing for part or all of the units under test on the wafer. In the test system including other wafer or other circuit board, the comparator can be on the wafer under test or on other wafer or circuit board. The manufacturing process of said other wafer includes but not limited to the same process as the wafer under test or behindhand process than that. The area of the other wafer or other circuit board includes but not limited to the same as or larger than the wafer under test. The structure of the other wafer or other circuit includes but not limited to the wafer with through silicon via or circuit board with via and metal wire or wafer with integrated circuit module double sides Also the layout circuit board with metal wire can be used as probe card, the solder ball be used as probe, the power and test stimulation can be transmitted to all or part of the input ports of all or part of the units under test through the solder ball and the metal wire.

The probe card can also parallel transmit the test stimulation and for the power to plural number of units under test using electromagnetic wave.

The characteristics of the tester in the system of this invention includes:
(a) it can generate or store configuration information of the connection between DUTs on the wafer and their corresponding testing assistant apparatus. It is capable of adjusting the configuration information accordingly base on the coordinate of the current die under the probe now, then transmitting the adjusted information to the wafer;
(b) it is capable of reading out from a wafer the location information of the DUTs on the substrate and the result of the corresponding comparison apparatus.

The characteristic of the tester can also include the ability of generating or storing data signal and control signal, which are the testing stimulations, for units under test on the wafer, and transmitting the stimulation to the wafer.

The characteristic of the tester can also include the ability of generating or storing the expected results corresponding to the test stimulation and transmitting the expected results to the wafer.

The characteristic of the tester can also include the ability of grouping, recording and outputting the location information of the DUTs on the wafer or in the die base on whether the comparison results of DUTs' meet the testing requirement.

This invention discloses an integrated circuit chip including a plural number of identical functional modules under test, The plural number of functional modules under test are the units under test; the integrated circuit chip also includes test assistant apparatus; the test assistant apparatus only works when the chip is in test mode; the test mode includes but not limited to running the same input stimulation in parallel; the testing assistant apparatus can be located partially in the DUTs or completely or partially outside the DUTs, including:

(a) a power supply circuit, which is connected to power supply ports of the assistant testing apparatuses;

(b) an input circuit connecting to input ports of a plural number of DUTs; the input paths are also used to send expected result to an input port of the comparison apparatus when using the expected results method;

(c) comparison apparatus having one input port connected to an output port of a DUT, and another input port either connected to the corresponding output port of another DUT, or connected to input path carrying expected result;

(d) registers, which are connected to the output port of the comparison apparatus and output paths, for storing output results of comparison apparatus;

(e) an output circuit, which is connected with output ports of a plural number of comparison apparatus and which outputs comparison result of corresponding comparison apparatus and the location information of correspond unit under test.

The input circuit in the integrated circuit chip can input the data signal and control signal to the unit under test within the integrated circuit chip through electric connection of wired interconnection circuit connected to the input ports of the units.

The input circuit can also include the conversion apparatus for converting the signal before sending to the input port.

The connection among the input circuit, the units under test and comparison apparatus in the integrate circuit can be fixed wires or configurable switches or a combination of both.

The test stimulation source which generates the data signal and control signal of the integrated circuit chip can be located outside or within the integrate circuit chip or stored inside the chip after generated outside of the chip.

The comparison apparatus can also include the conversion apparatus for converting the signal before comparison.

The comparison apparatus in the integrated circuit chip can also include result collection and compression apparatus for collecting and compressing compare results from the aspect of time and space.

The output path in the integrated circuit chip can be of fixed wires, configurable switches, or a combination of both.

The location information on the substrate of the unit under test and corresponding results of the comparator can be outputted through the output circuit of the integrated circuit chip or stored in the memory inside the integrated circuit chip.

The integrated circuit chip can mark the failed function module under test according to the test results stored in the memory. The software/hardware system can replace the failed function module with a correct-function module to achieve self-repairing if a correct-functional module is available.

This invention disclose a circuit board containing plural number of units under test with identical function, the unit under test is packaged chip; there are plural number of chip sockets on the circuit board for connecting the units under test; there are also interface for connecting tester on the circuit board; the circuit board also has testing assistant apparatus, including:

(a) at least one comparison chip;

(b) the electric connection between the comparison chip and the tester.

The circuit board in this invention can also include at least one buffer chip connects electrically to the unit under test and the ports of the tester.

The test stimulation of the unit under test can be transmitted from the tester to plural number of units under test through the electric connection on the circuit board directly or transmitted after the buffering of the buffer chip on the circuit board or transmitted in the electromagnetic wave form after the conversion of the electric signal from the tester using electromagnetic wave generator.

The comparator chip on the circuit board has plural number of appropriative input ports, which connect one-to-one to the output ports and bi-directional ports of the plural number of slots; the comparator chip can receive the output signals after the unit under test finishes the running of test stimulation and do parallel comparison between the output signals of each unit under test and the corresponding output signals of another unit under test then output the compare results.

The comparator chip on the circuit board has plural number of appropriative input ports, which connect one-to-one to the output ports and bi-directional ports of the plural number of slots; the comparator chip can receive the expected results from the tester; the comparator chip can receive the output signals after the unit under test finishes the running of test stimulation and do parallel comparison between the output signals of each unit under test and the expected results then output the compare results.

The comparison chip on the circuit board may also have result collection and compression apparatus used for collecting and compressing comparison results from the aspect of time and space then output the test results.

The test results of said comparison chip on the circuit board are transmitted to the tester through electric connection.

The circuit board can also include one chip, which has the functions of comparison chip and buffer chip.

The whole function of the circuit board can be realized by plural number of circuit boards electrically connected together. One of the plural numbers of circuit boards can realize the whole or part of the function.

The essential difference between the parallel testing method, apparatus and system of this invention and the current method, apparatus and system nowadays:

1. The solution disclosed by this invention is able to pass the same test stimulation and/or expected results to each and every said units under test located in a selected region on the substrate at one time, while the current method, apparatus and system are only able to pass the stimulation and/or expected results to one DUT at a time. Even the multi-site testing is fundamentally a sequential testing, unable to parallel testing all DUTs.

2. The solution disclosed by this invention is able to test each and every said units under test located in a selected region on the substrate at in parallel, while the current method, apparatus and system are only able to test DUTs in turn.

3. The comparison of this invention can be the comparisons in parallel between the output signals of all DUTs and the expected results, while the comparison of the current method, apparatus and system can only be the comparison between the output signal of one DUT and expected results.

4. The comparison of this invention can also be the comparisons in parallel between the output signals of the DUTs, which are not known if working, while the comparison of current method, apparatus and system can only compare between output of a DUT and the known reference values which include value stored in testing apparatus or the operation result of a known working unit.

Benefits of this Invention:

The current trends integrated circuit testing is mainly at the following three aspects:
1. Lower testing cost;
2. Shorten time to market;
3. Lower the defective parts per million rate.

The input stimulation can test a single or a plural number of integrated circuits simultaneously using this parallel testing method of this invention. The method only takes M+L+N*R testing time, and the conventional one at a time testing method takes N*M+L testing time, assuming M is the time needed for moving the probe card or the packaged IC, L is the time needed for testing stimulation, and R is the time to read out test result/characteristics. Wherein R is much shorter than M+L, so method of this invention reduces the testing time and thus testing cost by order of magnitude. It also reduces time to market. Due to the significant reduction in stimulation running times, the length of stimulation can also be increased due to the significant reduction in stimulation run time to increase test coverage which reduces defective parts per million rate. This method does not require extra tester channels, which helps the reduction of testing cost. The transmitting delay of high frequency signal through testing cable is avoided when the comparison apparatus are integrated on the wafer, thus enabling low end testers performing high frequency high end test.

BRIEF DESCRIPTION OF THE DRAWINGS

Reference will be made in detail to preferred embodiments of the invention, examples of which are illustrated in the accompanying drawings. Although the invention will be described in the context of these preferred embodiments, it should be understood that it is not intended to limit the spirit and scope of the invention to these particular embodiments.

FIGS. 7(a)-(c) illustrate how to determine failed dice in the testing process.

FIG. 11(a) illustrates an embodiment of the alignment mark placement in the invention.

FIG. 11(b) illustrates the possible placement of probing pads on wafer.

FIG. 11(c) illustrates the possible placement of probing pads in FCP (Flip Chip Package) or WLCSP (Wafer Level Chip Scale Package).

FIGS. 12(a)-(b) illustrates an embodiment of input channel and output circuit in a stepper field on wafer.

FIG. 18 illustrates a self-test wafer, wherein test stimulation generating apparatus 1801 is integrated on the wafer.

FIG. 19 illustrates a new type of wafer test system.

FIGS. 22(a)-(f) show four embodiments of testing the dice on the wafer under test through another testing wafer.

FIG. 25 illustrates an embodiment of a wafer testing apparatus which is able to provide enough current and given voltage to desired amount of DUT.

FIG. 26 illustrates an embodiment of a test result table used to store the test results of a plural number of function blocks within an integrated circuit chip.

FIG. 28 is a cross section view of wafer testing by using circuit boards.

FIGS. 29(a)-(c) illustrate embodiments of a test on a packaged integrated circuit.

DESCRIPTION OF THE EMBODIMENTS

Figure 1:
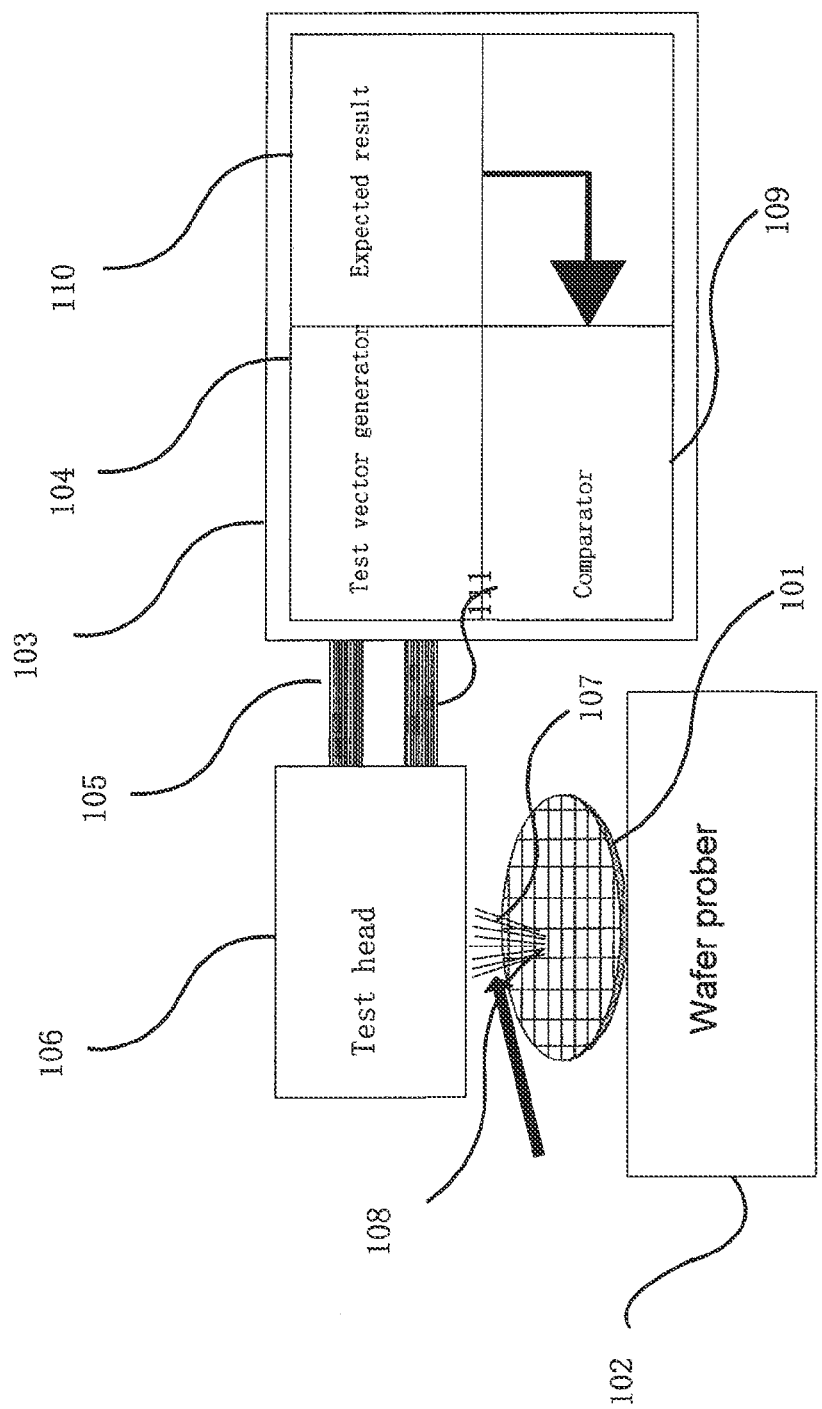
FIG. 1 shows common wafer test process in the prior art.
Figure 2:
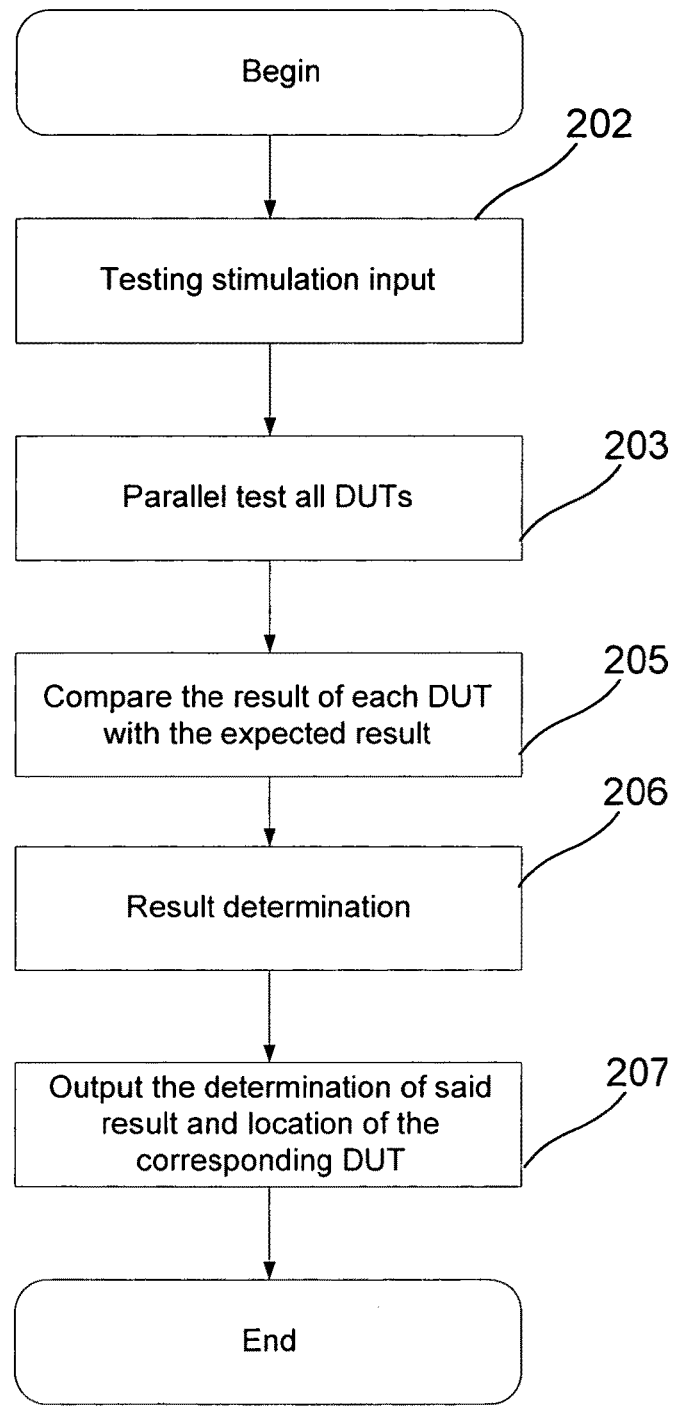
FIG. 2 illustrates a flow chart of wafer testing with the common substrate integrated circuit testing apparatus having expected test result.

FIG. 2 illustrates a flow chart of wafer testing with the common substrate integrated circuit testing apparatus having expected test results. The comparator in this embodiment may not include the determination of pass/fail function. The testing stimulation is provided in step 202, then all DUTs are tested in parallel in step 203. Each DUT's operation output is sampled in step 205, and the sampled output is compared with said the expected value, and the comparison result is recorded. Testing precision determines the sampling and comparing frequency. After completion of all the comparison of the sampled outputs, the final test result is generated in step 206, with the location of all said DUTs and the corresponding said test result. Wherein step 207, the location and the corresponding test result of each said DUT is outputted.

Figure 3:
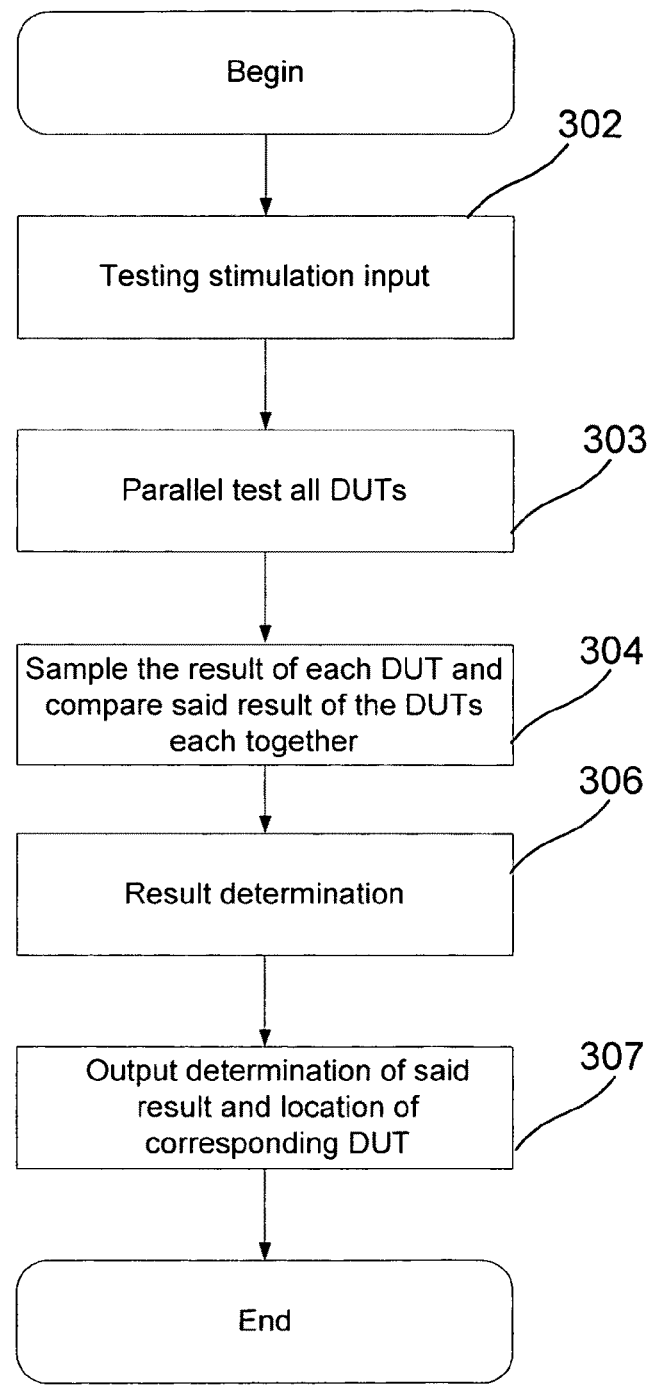
FIG. 3 illustrates a flow chart of wafer testing with the common substrate integrated circuit testing apparatus not having expected test result.

FIG. 3 illustrates a flow chart of wafer testing with the common substrate integrated circuit testing apparatus not having expected test result. The comparator in this embodiment includes the pass/fail determination function. The testing stimulation is provided in step 302, then all DUTs are tested in parallel in step 303. Each DUT's operation output is sampled in step 304, and the sampled output of one said DUT is compared with the corresponding said sampled of another DUT, and a signature of the comparison result is recorded. Testing precision determines the sampling and comparing frequency. After completion of all the comparison of the sampled outputs, the final test result is determined in step 306. Wherein step 307, the location and the corresponding test result of each said DUT is outputted. The signature is the test result of coordinate information of the failed or possibly failed unit. The possibly failed unit can be tested again if needed or simply accepted as a failed unit after completion of common substrate integrated circuit testing. Failed units can be marked by physical means.

Figure 4:
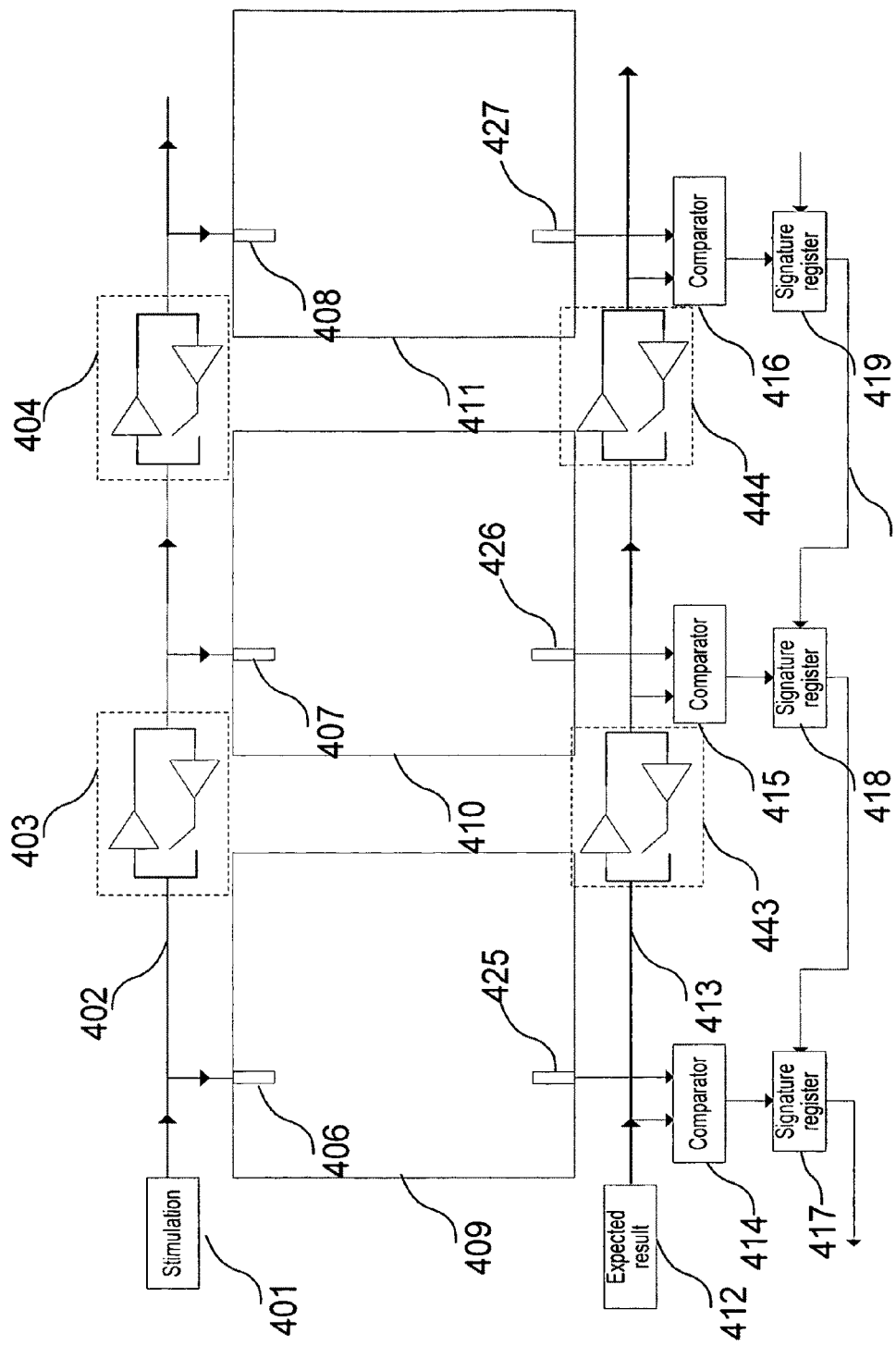
FIG. 4 illustrates the structure wherein the outputs of the dice are compared with expected result.

FIG. 4 illustrates the structure wherein the outputs of the dice are compared with the expected result. Input stimulation 401 goes through wired interconnection 402, bi-directional switches 403 and 404, both of which are configured as passing to the right, to die 409, die 410, and die 411 through input pads 406, input pads 407, and input pads 408. Expected results 412 goes from left, through wired interconnection 413 bi-directional switch 443 and bi-directional switch 444, both of which are configured as passing to the right, goes to comparator 414, comparator 415, and comparator 416. Operation output of die 409, die 410 and die 411 also goes to comparator 414, comparator 415, comparator 416 through output pad 425, output pad 426, output pad 427 respectively. The comparison/decision result of comparator 414, comparator 415 and comparator 416 are stored in signature register 417, signature register 418 and signature register 419 respectively.

The initial value of the signature registers are either set by external control signals or are set by self generated signals. The value of the signature register is changed whenever the corresponding comparator indicates the two set of inputs to the comparator are not equal/not matching, marking the corresponding die as possibly failed die. Signature register 417, register 418, signature register 419 and other signature registers can be connected as a chain 420 of shift registers to channel out the position information of the die under test and the corresponding compare/decision result. Stimulation 401 can be induced to internal blocks on the dice by metal wires directly, without using input pad 406, input pad 407 and input pad 408. Die output can also be channeled from internal blocks to external of the dice by metal wires directly, without using output pad 425, output pad 426 and output pad 427. The comparator can have a singular or plural number of inputs.

Figure 5:
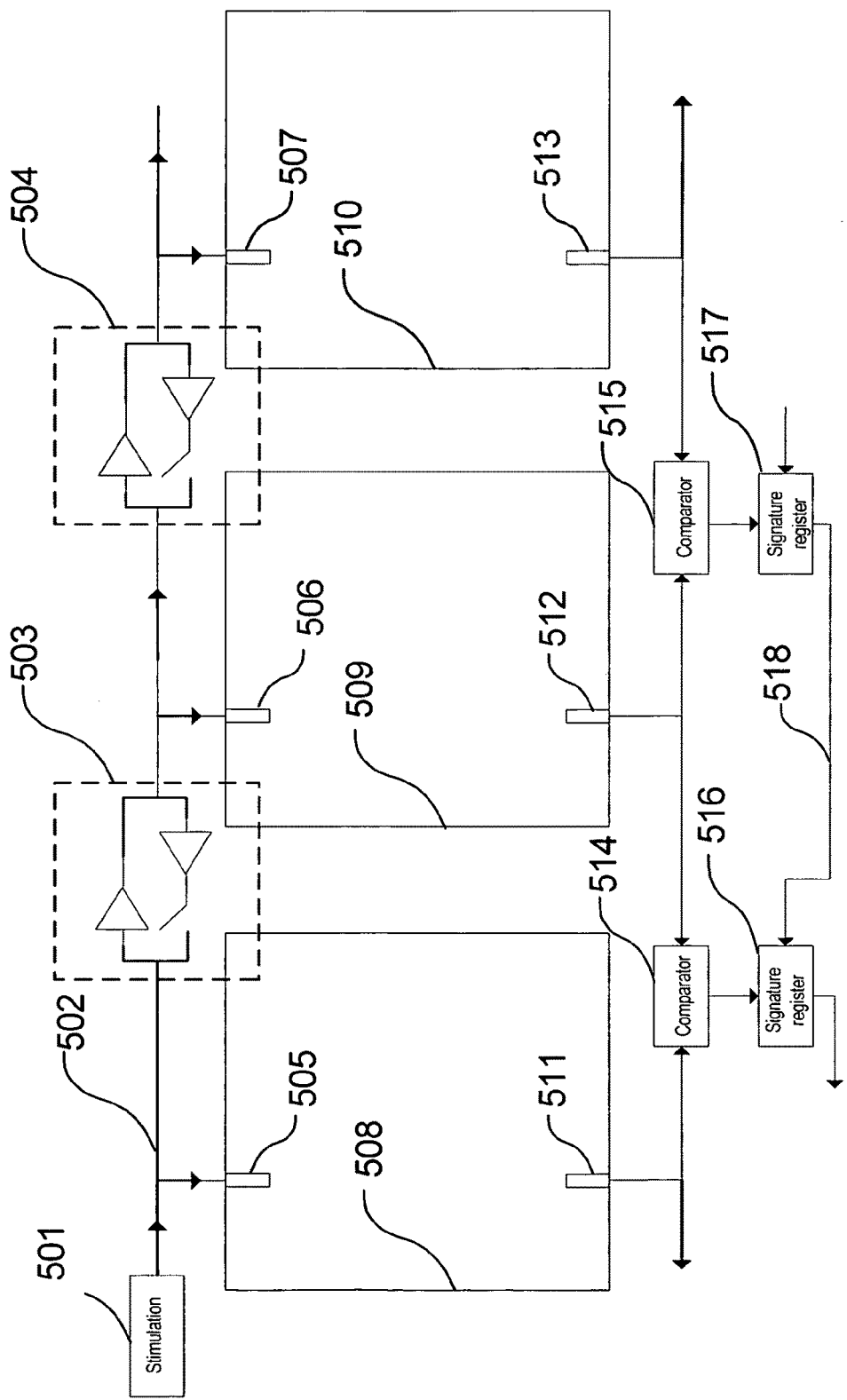
FIG. 5 illustrates the structure wherein the outputs of the dice are compared with each other.

FIG. 5 illustrates the structure wherein the outputs of the dice are compared with each other. Input stimulation 501 goes through wired interconnection 502, bi-directional switches 503 and 504, both of which are configured as passing to the right, to die 508, die 509, and die 510 through input pads 505, input pads 506, and input pads 507. Output from bottom of die 509 comes out of output pad 512 to comparator 514 and comparator 515. The output from bottom of die 508 comes out of output pad 511 also goes to said comparator 514 to be compared with the output from said die 509 while the output from bottom of die 510 comes out of output pad 513 also goes to said comparator 515 to be compared with the output from said die 509. The comparison/decision result of comparator 514 and comparator 515 are stored in signature register 516 and signature register 519 respectively.

The initial value of the signature registers are either set by external control signals or are set by self generated signals. The value of the signature register is changed whenever the corresponding comparator indicates the two set of inputs to the comparator are not equal/not matching, marking the corresponding die as possible failed die. The corresponding dice are marked as possibly failed dice if the output of neighboring dice are not matching. Signature register 517, signature register 518, signature register 519 and other signature registers can be connected as a chain 518 of shift registers to channel out the position information of the die under test and the corresponding compare/decision signature. Stimulation 501 can be induced to internal blocks on the dice directly by metal wires, without using input pad 505, input pad 506 and input pad 507. Die output can also be channeled from internal blocks to external of the dice by metal wires directly, without using output pads 511, 512 and 513. The comparator can have a singular or plural number of inputs.

Figure 6A:
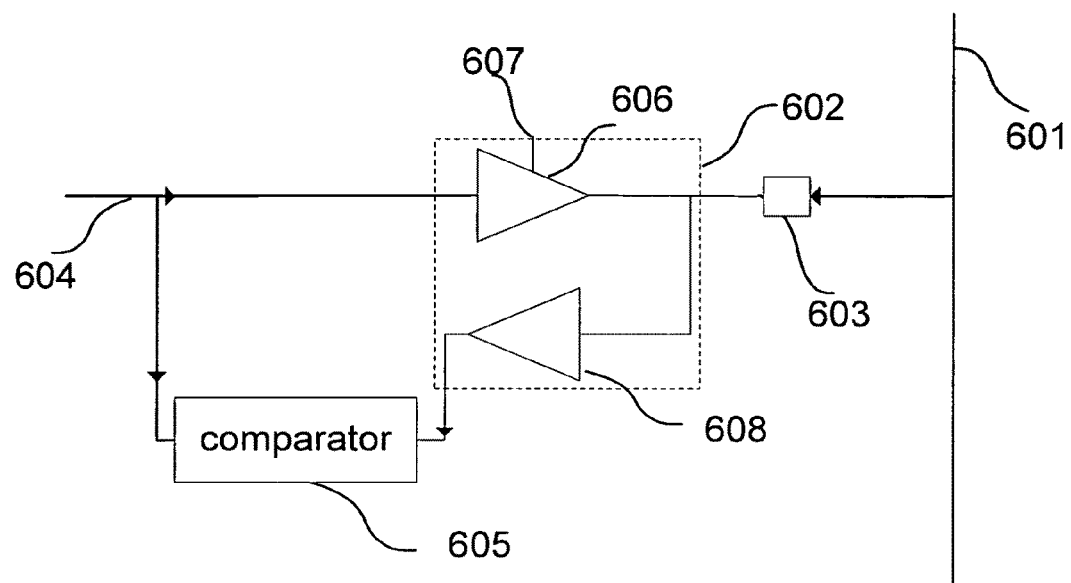
FIG. 6(a) illustrates an embodiment wherein the comparator is within the die under test.

FIG. 6(a) illustrates an embodiment wherein the comparator is within the die under test. Expected result or the operation result or neighboring dice are passed through passing network 601 and pad 603 of input/output buffer (I/O pin) 602 to the die under test and is compared with the corresponding operation result 604 in comparator 605. Wherein the output driver 606 is set high impedance and the input buffer 608 is enabled inside the input/output buffer 602.

Figure 6B:
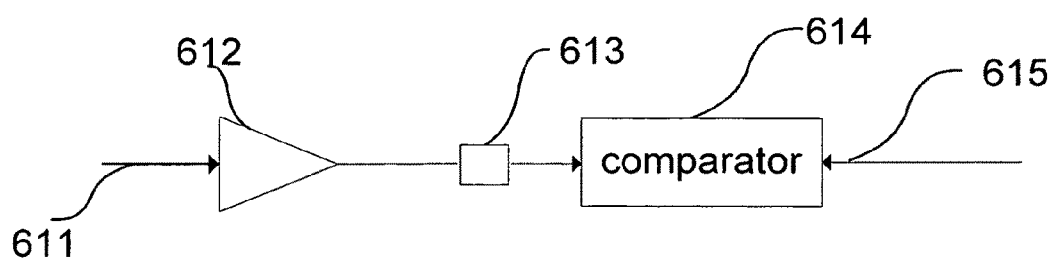
FIG. 6(b) illustrates an embodiment wherein the comparator is external to the die under test.

FIG. 6(b) illustrates an embodiment wherein the comparator is external to the die under test. The operation result 611 of the die under test is outputted through output driver 612 and its output pad 613 to comparator 614 and is compared with the expected result or neighboring die operation result 615.

FIGS. 7(a)-(c) illustrate how to determine failed dice in the testing process. In the diagram, operation results on the four sides of each DUT are respectively compared with the operation results on corresponding side of neighboring DUT by comparison apparatus, where, a diagram of comparison apparatus is marked white when comparison result is equal/matching, and is marked black when comparison result is not equal/matching. In this embodiment, the apparatus for determining failed dice can be on the wafer or in the wafer test equipment.

FIG. 7(a) illustrates the case that there is no failed DUTs, wherein, operation results on four sides of DUT 701 are respectively compared with the operation results on corresponding side of DUT 702, DUT 703, DUT 704, DUT 705 by wire 707. Comparator 706 is marked white indicating comparison result is equal/matching on corresponding side of between DUT 701 and DUT 704. Comparison results on all four sides in the illustration are equal/matching, so DUT 701 is functional.

FIG. 7 (b) illustrates the case of a partially failed DUT. Operation output on four sides of DUT 711 are compared with the operation output on corresponding side of DUT 712, DUT 713, DUT 714, DUT 715 respectively, wherein comparator 716, which connects to output of DUT 711 through wire 718, are marked black indicating comparison result between DUT 711 and DUT 712 is not equal/matching, and comparator 717, which connects to output of DUT 711 through wire 719, are marked black indicating comparison results between DUT 711 and DUT 714 are not equal/matching. The respective corresponding side comparison result of DUT 711 with DUT 713, and that of DUT 711 with DUT 715 is equal/matching, so DUT 711 is judged to be partially failed.

FIG. 7(c) illustrates the test case of a completely failed DUT. Operation results on four sides of DUT 721 are respectively compared with the operation results on corresponding side of DUT 722, DUT 723, DUT 724, DUT 725, and all comparison results are not equal/matching. Comparator 726, comparator 727, comparator 728, comparator 729, comparator 730, comparator 731, comparator 732, comparator 733 are all marked black, wherein wire 734 is used between DUT 721 and comparator 726. So DUT 721 is judged to be failed. The plural number of comparison results of a plural number of output ports can be compressed in space into a single comparison result through logically combining (e.g., through an AND function) the comparison results. The plural set of comparison results can also be reduced to a single result by an accumulator, thereby to save time. The reduction in space and time lowers the bandwidth requirement of the output pad and therefore speeds up the testing process.

Figure 8A:
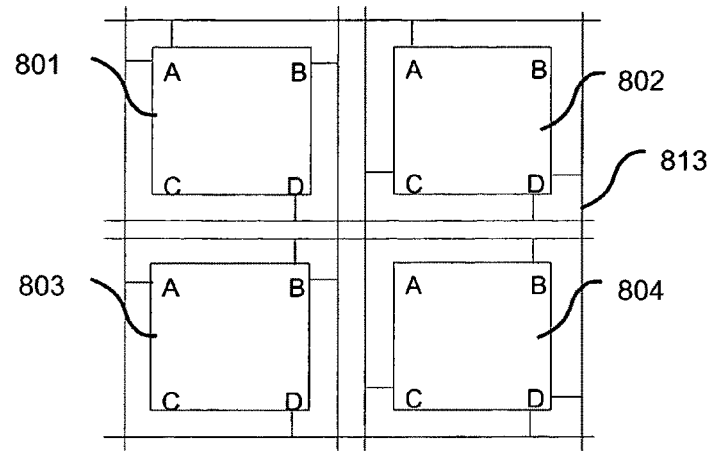
FIGS. 8(a)-(c) illustrate embodiments of neighboring DUTs placement in the present invention.
Figures 8B, 8C:
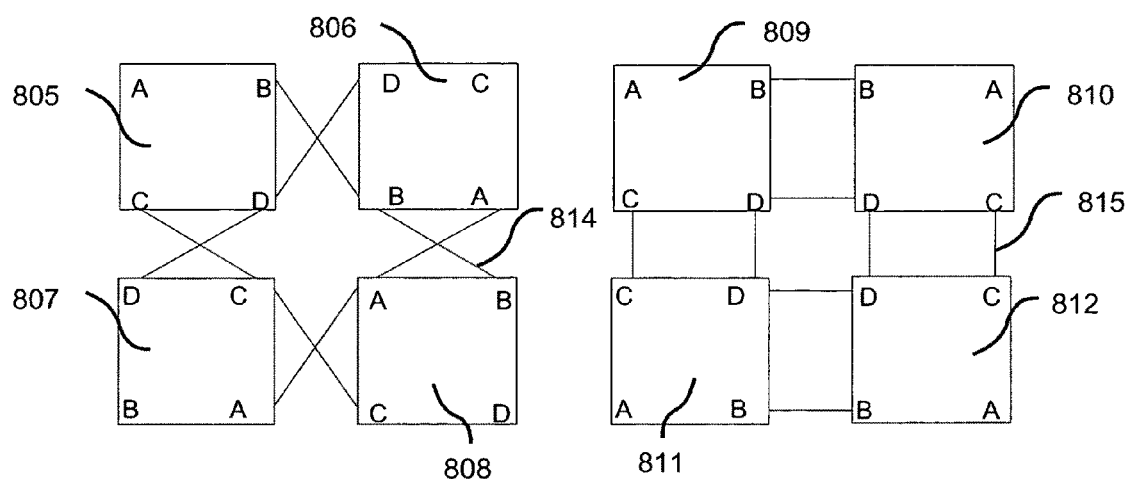

FIG. 8 illustrates embodiments of neighboring DUTs' placement in the present invention. A, B, C and D are four corners of the DUT. FIG. 8 (a) illustrates a normal placement, wherein DUT 801, DUT 802, DUT 803, DUT 804 are placed in same orientation, output ports of each DUT are compared with corresponding output ports on corresponding side of neighboring DUT through connecting wires. For example, output ports of DUT 801 are compared with the corresponding output ports of DUT 802. Wherein wire 813 is the connecting wire for comparison between the corresponding output ports of DUT 802 and 804. FIG. 8(*b*) illustrates rotating placement wherein the neighboring DUTs' placements are rotated 180 degrees. For example, the placement of DUT 806 is rotated 180 degrees as compared to DUT 805 and DUT 808, and the placement of DUT 807 is also rotated 180 degrees as compared to DUT 805 and DUT 808. So while making a test, the output ports of each DUT and the corresponding output ports of neighboring DUTs are close to each other, making the connection wire for output comparison shorter and easier to connect, as demonstrated by wire 814 between DUT 806 and DUT 808.

FIG. 8(*c*) illustrates a mirror image placement of DUTs, wherein the placement of neighboring DUTs are in mirror image. For example, the placements of DUT 809, DUT 810, DUT 809 and DUT 811 are all in mirror image to neighboring DUTs. So while making a test, the output ports of each DUT and the corresponding output ports of neighboring DUT are very close to each other, making the connection wire for output comparison short and easy to connect, as demonstrated by wire 815 between DUT 806 and DUT 808.

This embodiment is particularly suitable for testing orientation insensitive chips such as RFID.

Figure 9:
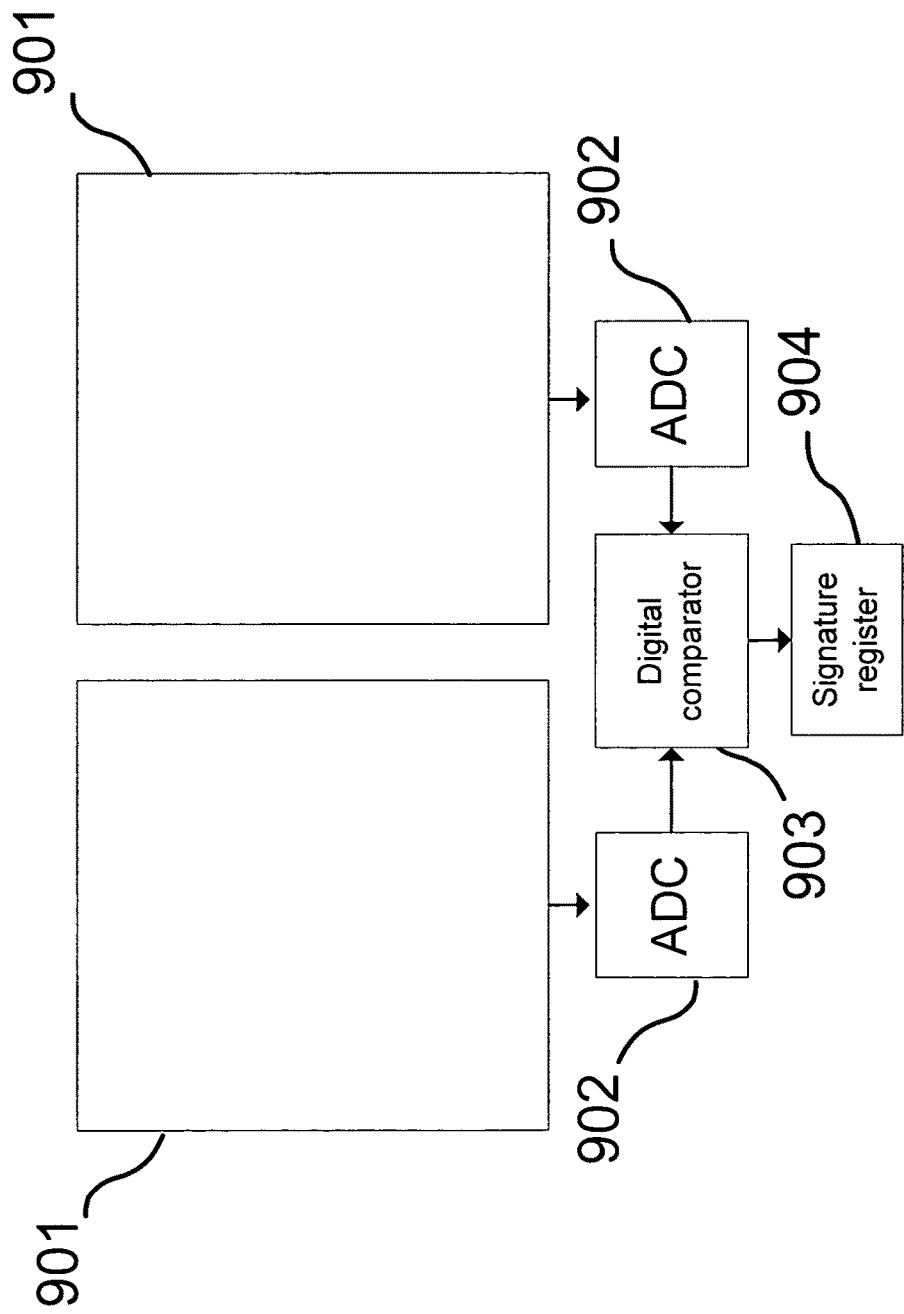
FIG. 9 illustrates operation result of comparing analog signals.

FIG. 9 illustrates the comparison of analog operation results. Analog to digital converters 902 samples and converts the analogy operation result of dice 901 into digital signals. Digital comparator 903 compares the two said digital signals and stores the comparison/judgment result into signature register 904. The input to dice 901 can be a native analog signal, or an analog signal converted from a digital input by a D/A converter.

Figure 10:
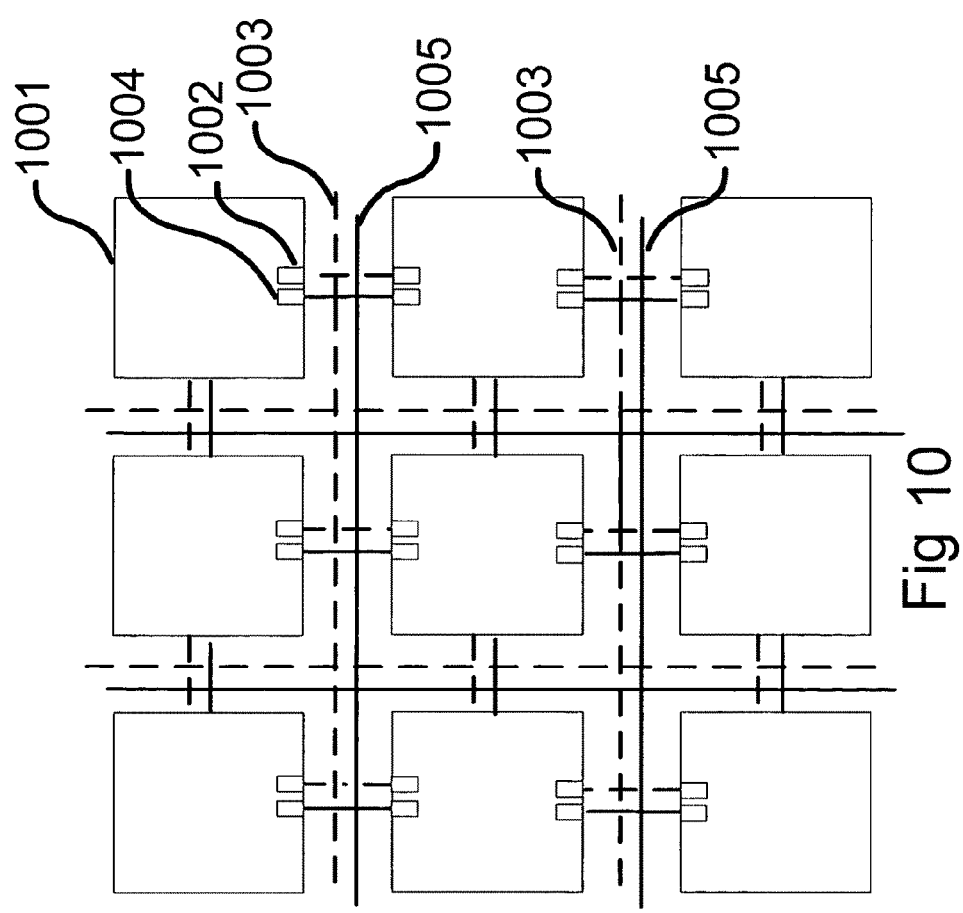
FIG. 10 illustrates an embodiment of power supply in the invention.

FIG. 10 illustrates an embodiment of power supply in the invention. All power pads 1002 in the dice 1001 can be connected with global power mesh 1003 directly or be connected in one of the zoned local power meshes. All ground pads 1004 in the dice can also be connected with global ground power 1005 directly or be connected with one of the zoned local power meshes. The ground pads in global mesh or in zoned mesh can be connected together, while each said power pad can be connected to global power mesh or zoning power meshes through a large size PMOS device, and the gates of the PMOS devices can be connected to a network for reconfigure, controlling the on or off of power supply to each said dice. The pads are made of metal, placed on the die or outside of the die, connecting to aforementioned structure by metal wires.

FIG. 11(*a*) illustrates an embodiment of the alignment mark placement in the invention. There is a 60-80 microns scribe line 1101 between each of dice in wafer. Alignment mark 1102 using for alignment of mask layers is typically placed in scribe line 1101 and occupies every layout layers. The alignment mark can be moved to corner pads 1104 of the die to yield scribe lines for long wires of the invention. The input signal channel, comparison apparatus and output circuit can share with the WAT test structure for the wafer acceptance test. The sharing can be design structure of this invention around the WAT test structure or share part of the WAT test structure, such as the probing pads of the WAT test structure for simulation input.

FIG. 11(*b*) illustrates the possible placement of probing pads on wafer. In the invention, probing pads are used to input clock, configuration information to the test network. Probing pads can be in place of unused (NC) pads point A 1112 and point B 1113 or corner pads point C 1114 on the die 1111. Probe pads can be placed on the corner pads in die 1111, such as placement C 1114. Probe pads can also be placed in scribe line 1101, as indicated by point D 1117 and point E 1118.

FIG. 11(*c*) illustrates the possible placement of probing pads in FCP (Flip Chip Package) or WLCSP (Wafer Level Chip Scale Package). The non connection pad 1122 of the dice 1121 can be used as probing pads.

FIGS. 12(*a*) and (*b*) illustrate an embodiment of input path and output path in a stepper field on a wafer. FIG. 12(*a*) illustrates input path in a stepper field on the wafer, while FIG. 12(*b*) illustrates output path of DUTs within a stepper field on the wafer.

FIG. 12(*a*) illustrates, test simulation is transferred from probe 1201 to each said die under test (such as test die 1203) in stepper field 1206 through wires 1202 on a scribe line. The wires on the scribe line in this embodiment are fixed in a layout phase. Each die under test operates under the same test stimulation. The result of the operation of each die under test is compared with the expected result or result of the neighboring DUTs to generate comparison/judgmental result.

FIG. 12(*b*) illustrates, in the stepper field 1206, comparing or judging results of each said die under test is read out by external apparatus through an output path, which consists of a chain of shift registers and hard wires 1204 which are fixed during the layout phase, and through probe 1201.

Figure 13A:
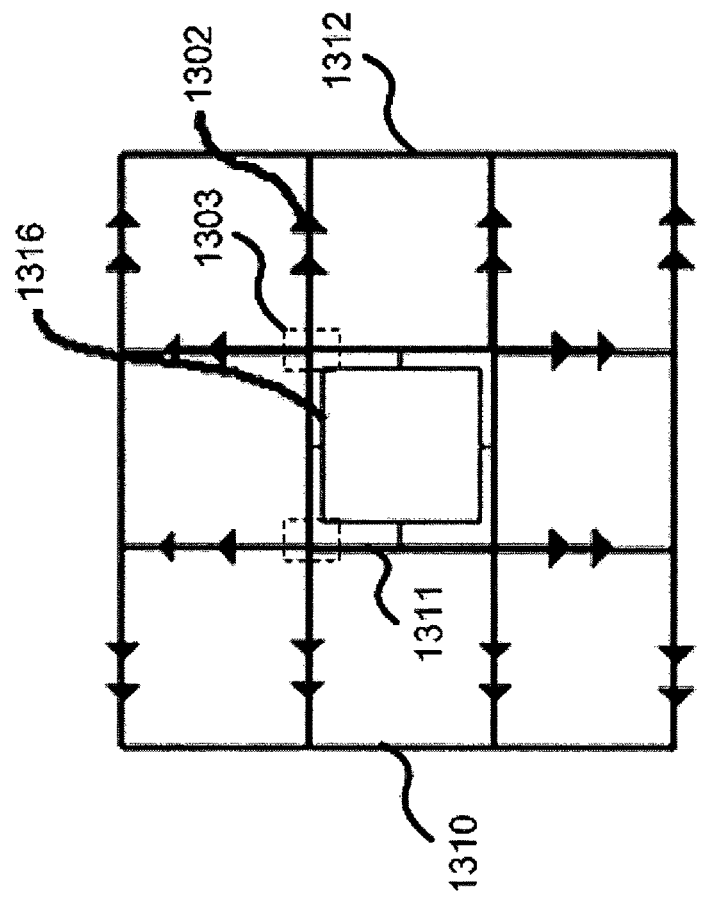
FIGS. 13(a)-(b) show an embodiment of configuration about circuit connection when the dice compares with each other.
Figure 13B:
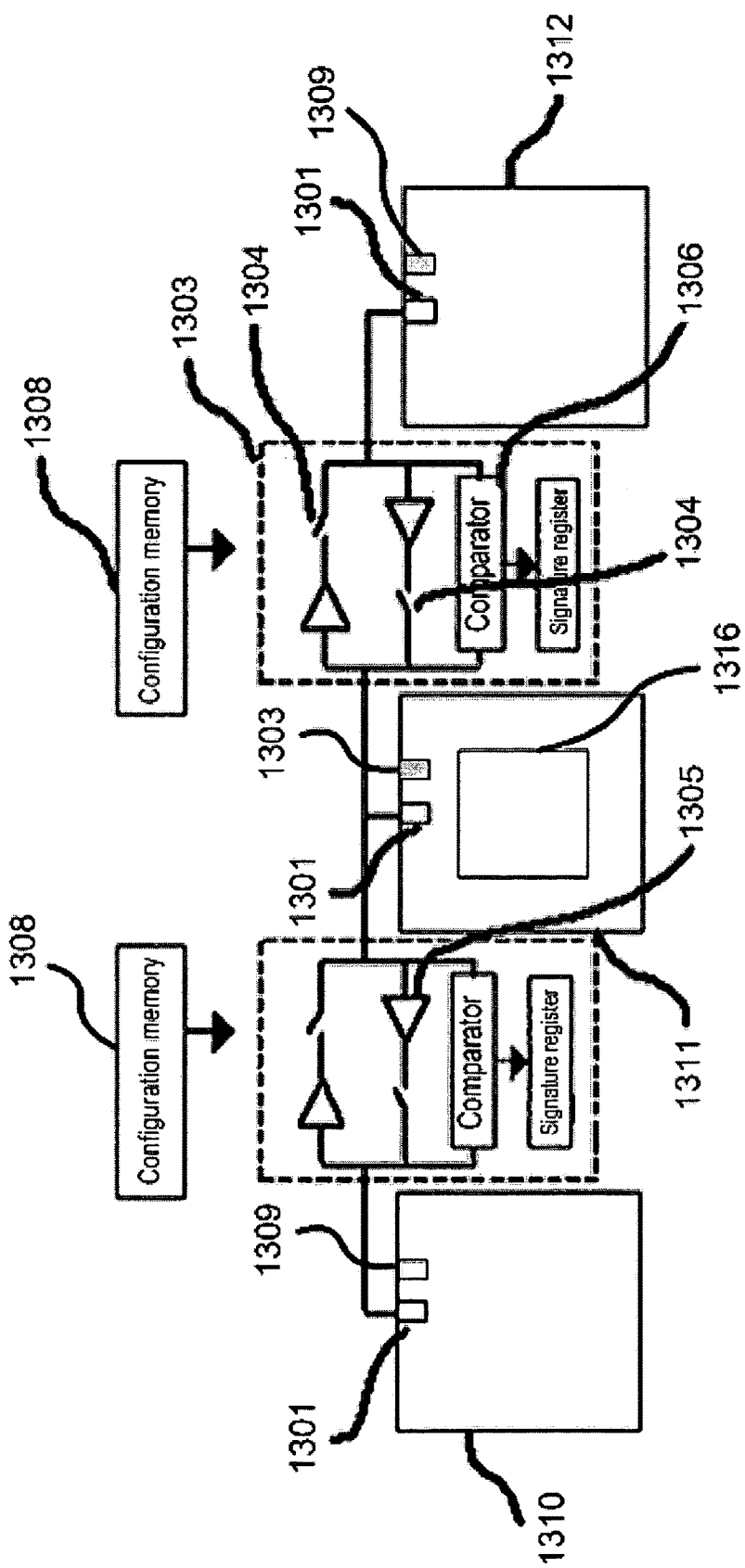

FIG. 13(*a*) and (*b*) illustrate input/output path configuration embodiment in comparing outputs of DUTs with each other, wherein FIG. 13(*a*) is a top view showing relation of neighboring DUTs and FIG. 13(*b*) is a close view highlighting connection between three dice. The probe pins of probe card 1316 lands on pads of die 1311 and sends in the input stimulation. The input stimulation can also be passed to dice 1310 and 1312 through inter connection path 1302 which consists of a plural number of basic transfer units 1303. Under the control of a configuration network, bi-directional switch 1304 within the basic transfer unit 1303 transform signal from left to right (or from right to left), from up to down (or down to up), enabling input stimulation from the probe, which lands on any die on the wafer, to be passed to all other dice on the wafer.

The bi-directional switch 1304 is set as one direction pass for stimulation input and set as neither direction pass for output comparison. The transform direction of the bi-directional switch is set by configuration memory 1308 alone or is set by a combination of input/output control output pad 1309 of the DUT and configuration memory 1308 during the aforementioned one direction transform. Driver 1305 in the basic transfer unit 1303 buffers up passing signals to minimize signal attenuation. The driver 1305 can be omitted if the expected attenuation is little. Latches can be added to the inter connection path to pass the signal in a pipelined fashion. During result comparison, the bi-directional switch 1304 is set to be off in both direction and outputs of pads 1301 are applied to input of comparator 1306 for comparison. Pads 1301 in this embodiment are input/output pads, pure input pads or output pads are the subsets of this embodiment.

Figure 14A:
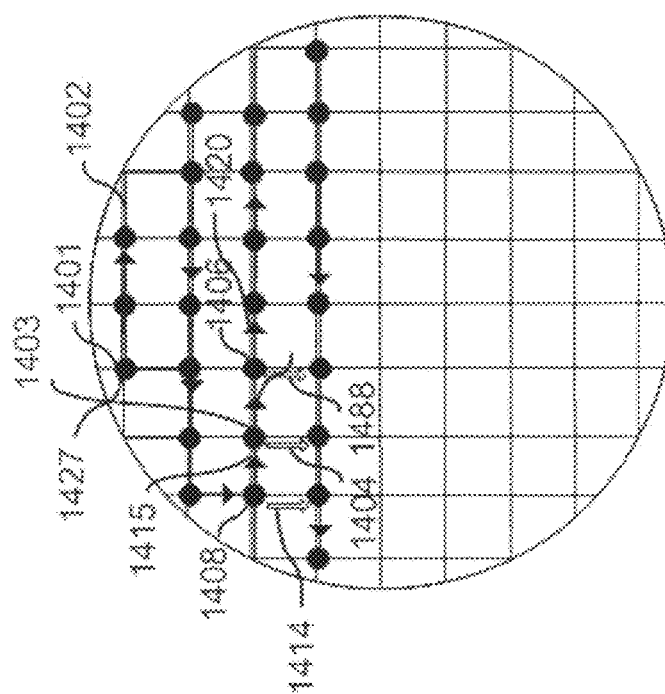
FIGS. 14(a)-(b) illustrate an embodiment of the configuration method of this invention.
Figure 14B:
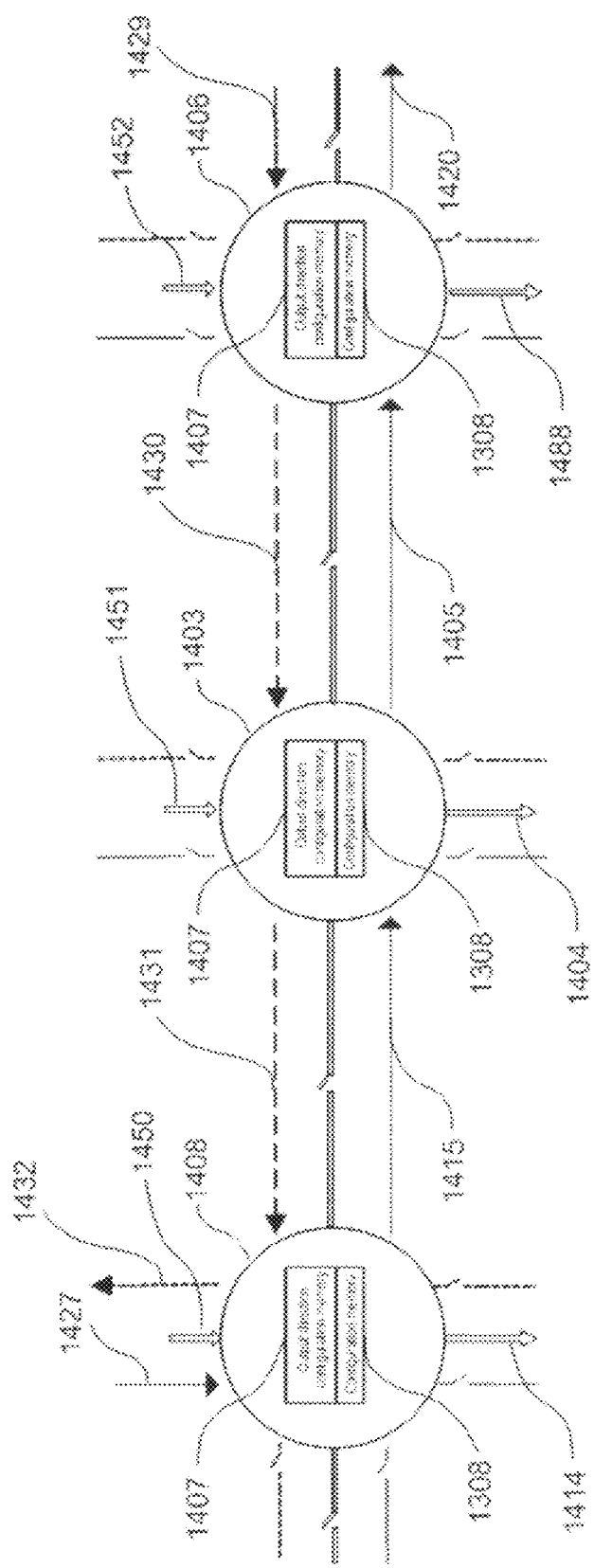

FIG. 14 illustrates an embodiment of the configuration method of this invention. The wired interconnection paths and output paths should have different topology structures. The input paths should pass input stimulation from where probe lands to all four directions in the shortest possible path length while the output path should go by each and every unit under test in series. The pass direction of the wired paths for input and output may be different on each node.

The purpose of this embodiment is to concurrently set up a serial output path which passes the compare/judgment results of all units under test to the unit where the probe lands on and set up input paths to pass input stimulation from the DUT where the probe lands on to all four directions by configuration in series. Using method of configuring one node at a time to determine the next node to pass the next configuration information to construct a chain that passes by each and every DUT from the position where the probe lands. The real compare/judgment result will be passed on this chain in the opposite direction as the set chain was set up.

The wired interconnections are also configured concurrently during the set up of the chain. The configuration information passes through each and every node of this chain including configuration information for interconnection circuit and output path structure. The implementation in particular is passed configuration information and clock signal 1427 to all the nodes through network 1402 from the position of the probe 1401 as illustrated by FIG. 14(*a*). As for node 1408 the incoming clock signal and node configuring signal 1427 come in from the top, configuring the configuration memory 1308 which controls the passing direction of the stimulation signal and the next-node-direction register 1407 which controls the output circuit passing direction within node 1408.

The content of the next-node-direction register 1407 indicates the construction to the right of compare/judgment result output circuit which includes the signal clock passing channel and configuration information passing channel in the direction and the compare/judgment result passing channel opposite to the direction. The content of the configuration memory 1308 indicates passing the input stimulation 1414 from top to bottom. As for node 1403, the incoming clock signal and node configuring signal 1427 come in from the node on the left 1408 to the current node 1403, configuring the configuration memory 1308 which controls the passing direction of the stimulation signal and the next-node-direction register 1407 which controls the output circuit passing direction within node 1403.

The content of the said next-node-direction register 1407 indicates the construction to the right of compare/judgment result output circuit which includes the signal clock passing channel and configuration information passing channel in the direction and the compare/judgment result passing channel opposite to the direction. The content of the configuration memory 1308 indicates passing the input stimulation 1404 from top to bottom. As for node 1406, the incoming clock signal and node configuring signal 1427 come in from the node on the left 1403 to the current node 1406, configuring the configuration memory 1308 which controls the passing direction of the stimulation signal and the next-node-direction register 1407 which controls the output circuit passing direction within node 1406.

The content of the next-node-direction register 1407 indicates the construction to the right of compare/judgment result output circuit which includes the signal clock passing channel and configuration information passing channel in the said direction and the compare/judgment result passing channel opposite to the direction. The content of the configuration memory 1308 indicates passing the input stimulation 1488 from top to bottom. Within every node, content of configuration memory 1308 and next-node-direction register 1407 always remain the same once set up. Further configuration passing this node will not alter the contents.

The contents are reset to initial value at loss of power supply or at external reset signal. In this manner, clock signal and node configuration information are passing to the each node on the chain as needed through node configuration information and clock signal paths 1427, 1415, 1405 and 1420 one at a time. At the same time, the input stimulation passing directions and the comparison/judgment result passing circuit in opposition direction which consists of comparison/judgment result passing paths 1429, 1430 and 1431 are set up concurrently. FIG. 14(*b*) illustrates the connections between node 1408, 1403 and 1406.

Figure 15B:
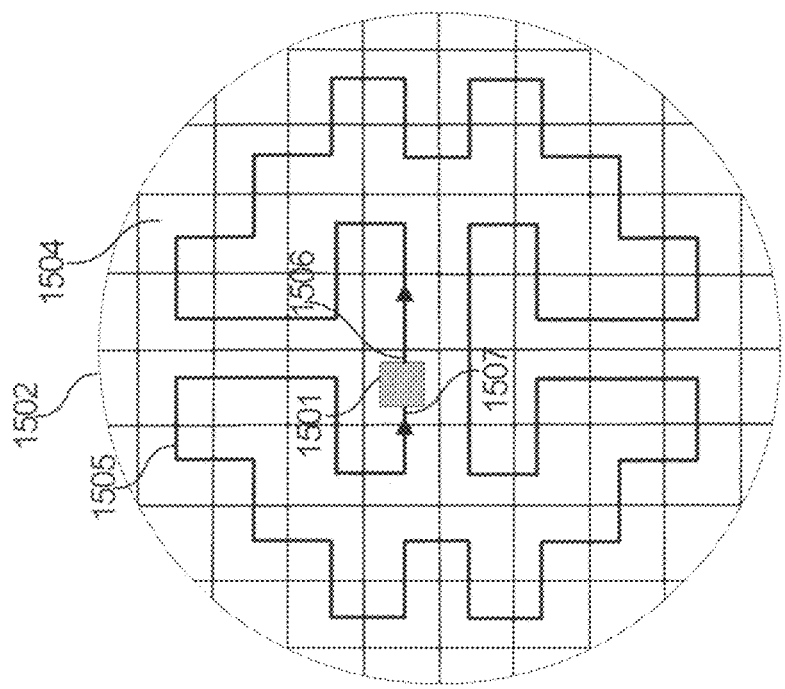
FIG. 15(b) illustrates the output circuit of comparing/judgment results on the wafer.
Figure 15A:
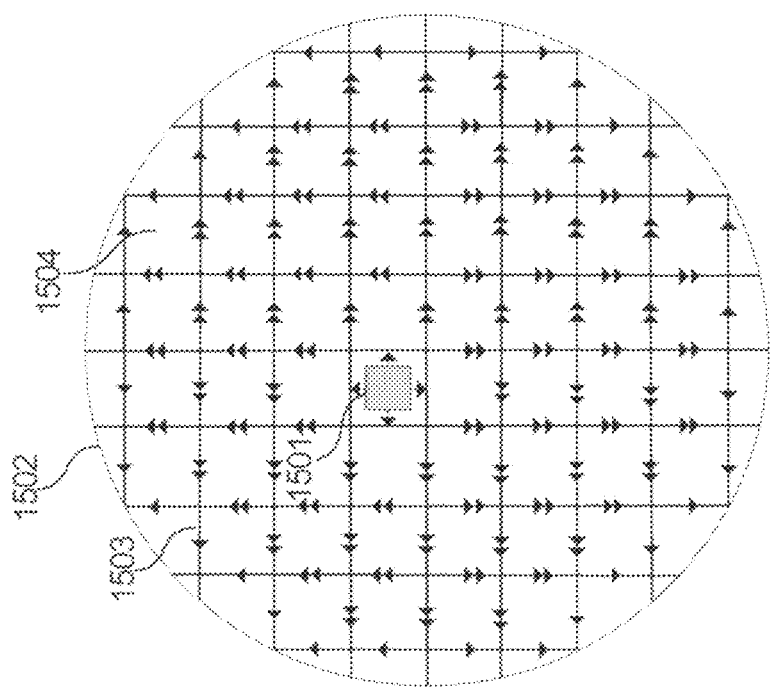
FIG. 15(a) illustrates an embodiment of input channel of the said wafer test.

FIG. 15(*a*) illustrates an embodiment of input channel of the wafer test. This illustration is a top view. Probe card 1501 passes input stimulation to each of dice 1504 through input channel 1503 on wafer 1502. Wherein the input channel 1503 can be configured to change input channel paths. Test stimulation can be transferred to each die without moving probe card physically to save test time. Alternatively, test stimulation can be transferred to part of the wafer area for zoned test.

FIG. 15(*b*) illustrates the output circuit of comparing/judgment results on wafer. This illustration is a top view. There is an output circuit 1505 on wafer 1502. This output circuit connects all the signature register of the dice under test 1504 to form a chain of shift registers, through which the comparison/judgmental result in the signature registers can be read out in serial without moving the probe card 1501. It can also be configured to read out only the comparison/judgment result of the DUTs in a region on the wafer.

A pre-test can be run after output circuit is established to ensure the functionality of the input path and output circuit of comparison/judgmental results 1505. Input can be passed from probe card 1501 through the node 1506 to the comparison/judgmental result circuit. Then read out from node 1507 through probe card 1501 can be compare with the input. If the input and output equal to each other or match, the pre-test is passed. Otherwise the pre-test fails. If the pre-test fails, the probe card 1501 can be moved to another DUT to establish input path and comparison/judgment result output circuit again, and repeat the self pre-test. Under the self pre-test mode, the stimulation for self test are passed to every DUT through the input paths, and the stimulation of self pre-test are read out in serially through comparison/judgmental result output circuit.

The input path and comparison/judgmental result output circuit in the FIG. 15(*a*) and FIG. 15(*b*) come from the circuit illustrated in FIG. 14.

Figure 16:
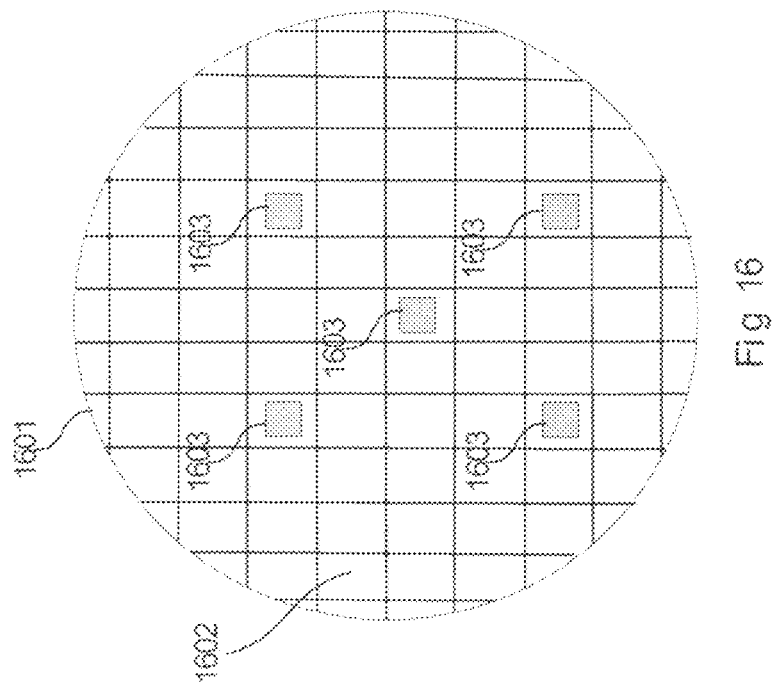
FIG. 16 illustrates a wafer with large current interface.

FIG. 16 illustrates a wafer with large current interface. There are several large current interfaces 1603 in a wafer besides normal dice 1602. These interfaces 1603 are connected to the power supply of the normal dice through hard wires. The large current passing capability of the interface enables the high frequency testing of plural number of normal dice in a region. The special large current probe are needed to work together with the large current interface.

Figure 17:
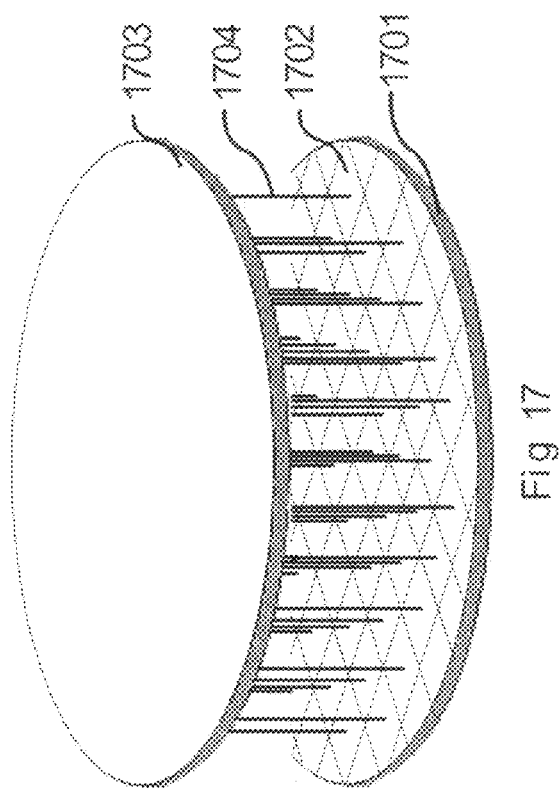
FIG. 17 illustrates a wafer test of radio frequency dice.

FIG. 17 illustrates a wafer test of radio frequency dice. During the testing of a wafer 1701 containing radio frequency dice, there is a receiving antenna or coupler 1704 on the probe card 1703 corresponding to the antenna input pad of each die under test 1702 to enable the transmitting of test stimulation and power supply to the dice through electromagnetic wave. The result is transmitted to comparison apparatus through wires on the wafer. Comparison/judgmental result can be generated by comparing the operation results of the dice under test (such as radio frequency die under test 1702) with each other or comparing the results of the dice under test with expected results. Comparison/judgmental result can be transmitted to the signature recording apparatus through the probe card 1703, to realize the testing of wafer containing radio frequency dice. Test simulation and power supply can also be transmitted to die under test in a region on the wafer only. Test simulation and power supply can be directly transmitted to the dice which have build-in antenna by electromagnetic wave.

FIG. 18 illustrates self-test wafer, wherein test stimulation generating apparatus 1801 is integrated on the wafer. The test stimulation generating apparatus generates and passes test stimulation to every DUT (such as DUT 1802) on the wafer, and every DUT's corresponding output ports are connected to the comparison apparatus on the wafer 1803. The wafer 1803 itself has a complete testing environment. When power supply is provided, the wafer 1803 itself can complete all testing of DUTs independently without an external tester. The comparison/judgmental result can be outputted to a signature recording apparatus through a probe card. In this embodiment, test stimulation generating apparatus 1801 can also be placed in the scribe line on the wafer 1804 to avoid occupying die's area.

FIG. 19 illustrates a new type of wafer test system. This structure consists of a tester 1901 and a special testing apparatus 1902 connected by a cable 1903. This structure tests DUT 1905 on wafer prober 1904. Through its probe pins 1906 contacting all the power and ground pads of the dice on the said wafer 1905, the special testing apparatus 1902 is capable to provide large power supply current to the whole wafer or selected zone on the wafer. The special testing apparatus 1902 transfers the test stimulation generated by tester 1901 to a plural number of DUTs on the said wafer. Every DUT runs the input stimulation in high speed, the comparison/judgmental results are exported to the tester 1901 through the special testing apparatus 1902 and electric cable 1903. If the testing results are comparison result, The tester 1901 judge the possible failed unit based on comparison result. This system is also capable of performing conventional single die testing on possible failed dice and is capable of marking the failed dice.

Figure 20:
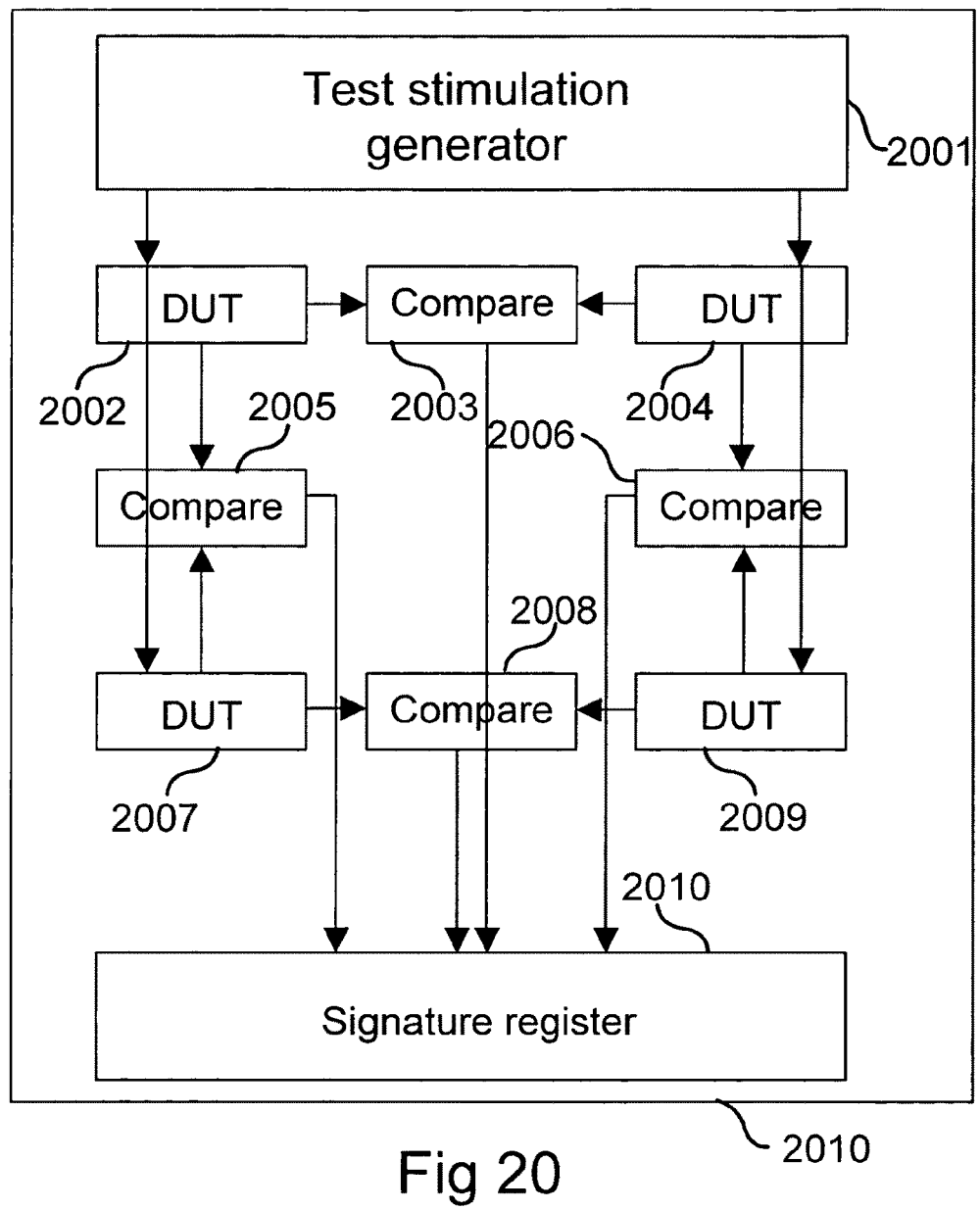
FIG. 20 illustrates the interior test structure of multi-operation unit/multi-core integrated circuit chip.

FIG. 20 illustrates the internal test structure of a multiple functional unit/multi-core integrated circuit chip. Within the said multiple functional unit/multi-core integrated circuit chip 2011, test stimulation generated by test stimulation generator 2001 is delivered to every functional unit/core under test 2002, 2004, 2007 and 2009. Every unit under test 2002, 2004, 2007 and 2009 runs the same test stimulation and produce its own output. The comparators 2003, 2005, 2006 and 2008 compare the said corresponding outputs to each other and generate comparison/judgmental results. The testing results will be writing into signature register 2010. So all the steps above realize the testing of multiple functional unit/multi-core. In this embodiment, outputs of units under test are compared with each other. In other embodiment, outputs of units under test are also feasible.

Figure 21:
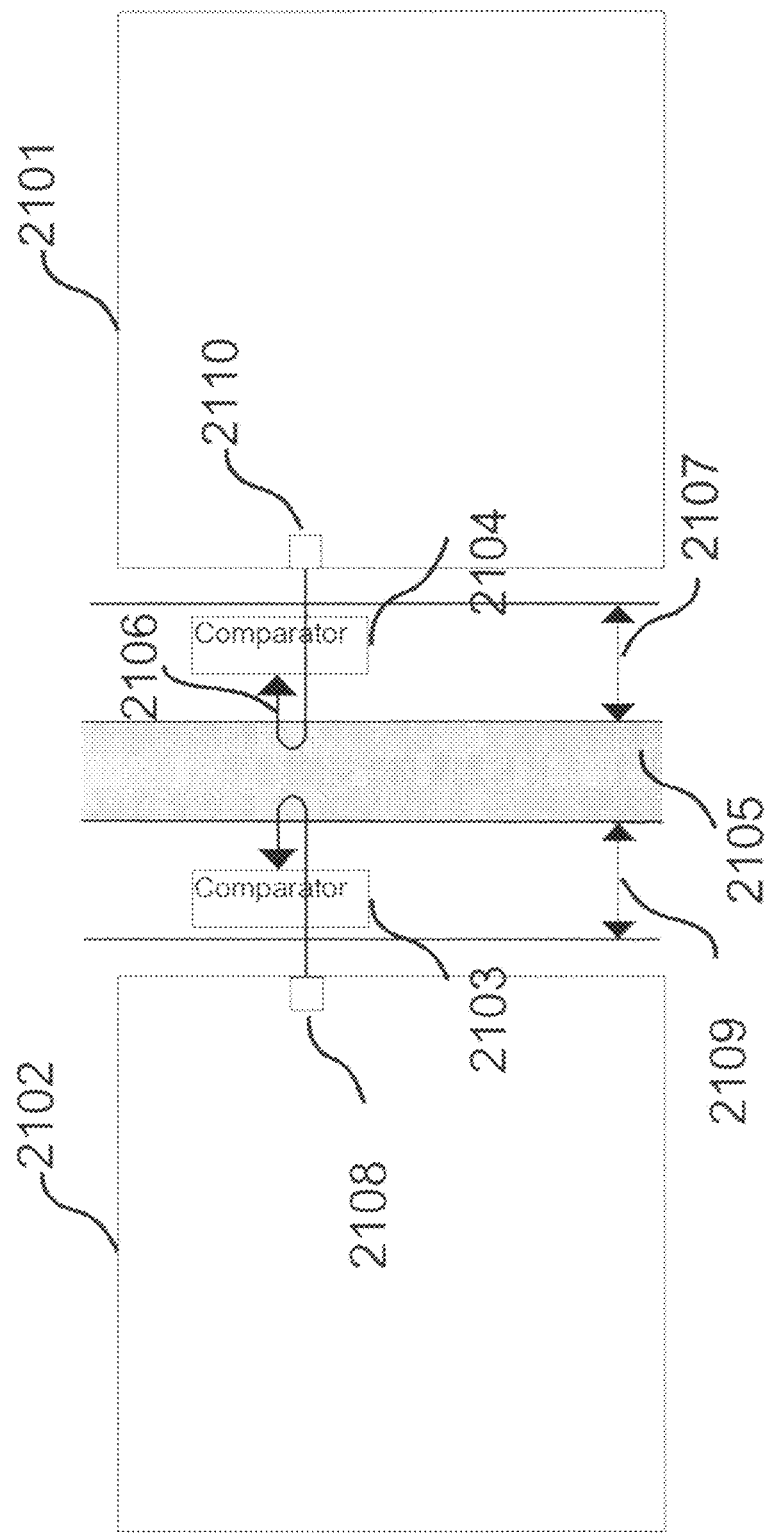
FIG. 21 illustrates a connection between die output and comparator.

FIG. 21 illustrates a connection between die output and comparator. The comparators 2103 and 2104 are placed on the scribe line in possible cut area 2107, certain-cut area 2109. The wires between output pads 2110 and 2108 of said die's 2101 and 2102 and comparators 2103 and 2104 must go through the certain-cut area 2105. This will make it certain that the comparators only work during testing. The wires between said die's output pads and comparators are cut after the wafer sawing, so the load of the comparators are not seen by the output pads.

FIGS. 22(a)-(f) show four embodiments of testing the dice on the wafer under test through another testing wafer. In the first embodiment (FIG. 22 (a)), as a part of the testing system, the testing wafer 2201 is placed on top of the wafer under test 2202.

In FIG. 22(b), tiny solder balls 2205 are placed on the said testing wafer 2201 in positions 2204 corresponding to pads of dice on wafer under test 2202 to pass power supply/test stimulation to the DUTs on the said wafer under test. Region 2203, which is not corresponding to dice on wafer under test, on the said testing wafer 2201 is reserved for testing cable 2206 attachment.

FIG. 22(c) illustrates the cross-section of the embodiment. The solder ball 2205 on the testing wafer 2201 corresponds with the pads of the wafer under test 2202. The testing wafer 2201 is pressed by pressing apparatus 2210, so the pads and solder ball of the two said wafers are in firm contact. Testing cable 2206 is connected to reserved region 2203 of the testing wafer's 2201 through clamp 2208, taking advantage of the clearance created by solder balls between the said two wafers. Test power supply/stimulation is passed to testing wafer 2201 through testing cable 2206 and clamp 2208 when testing. And then the said test power supply/stimulation is passed to every die's pads through the solder ball 2205 as testing input. The running results of the test stimulation can be compared on the wafer under test It can also be passed to testing wafer, using comparators on the testing wafer to compare.

FIG. 22(d) is the second embodiment. Testing wafer 2211 is a larger wafer than the wafer under test 2202. The testing cable 2206 can be directly connected to part of the testing wafer 2211 which is extended beyond the wafer under test 2202, so it solves the problem of testing cable 2206 thickness problem in FIG. 22(c). During testing in this embodiment, the power supply and test stimulation are passed to testing wafer 2211 through testing cables. Then the power supply and test stimulation are passed to the corresponding input pad of every die 2202 on the wafer under test 2202 through solder balls 2212. The operation results of the test stimulation can be compared on the wafer under test. It can also be transferred to testing wafer, using comparators on the testing wafer to compare.

FIG. 22(e) is the third embodiment. In this embodiment, wafer under test 2215 and testing wafer 2211 are of the same size originally, but one side of wafer under test 2215 was cut off while testing wafer 2211 is still a complete wafer. During testing, the power supply and test stimulation are passed to testing wafer 2211 through testing cable, and then the power supply and test stimulation are passed to the corresponding input pad of every die 2202 through solder ball 2212. The operation result of the test stimulation can be compared on the wafer under test, and it can also be transferred to testing wafer, using comparators on the testing wafer to compare. Only one side of wafer under test 2215 is cut off in the embodiment, but in real application, more than one side can be cut off base on the requirement.

FIG. 22(f) is the fourth embodiment. Testing wafer 2214 is a wafer with TSV. In this embodiment, testing cable 2216 connects the back side of the testing wafer 2214 instead of the front side. The power supply and test stimulation are passed to wafer under test 2202 through TSV hole. To merely illustrate the technical concept, the pressing apparatus 2210 and clamping device 2208 are omitted.

In the afore embodiments, the solder ball can be placed on the testing wafer to connect the pads on the wafer under test, or be placed on the wafer under test to connect the pads on the testing wafer, or be placed on both wafer under test and testing wafer to connect to each other.

Figure 23:
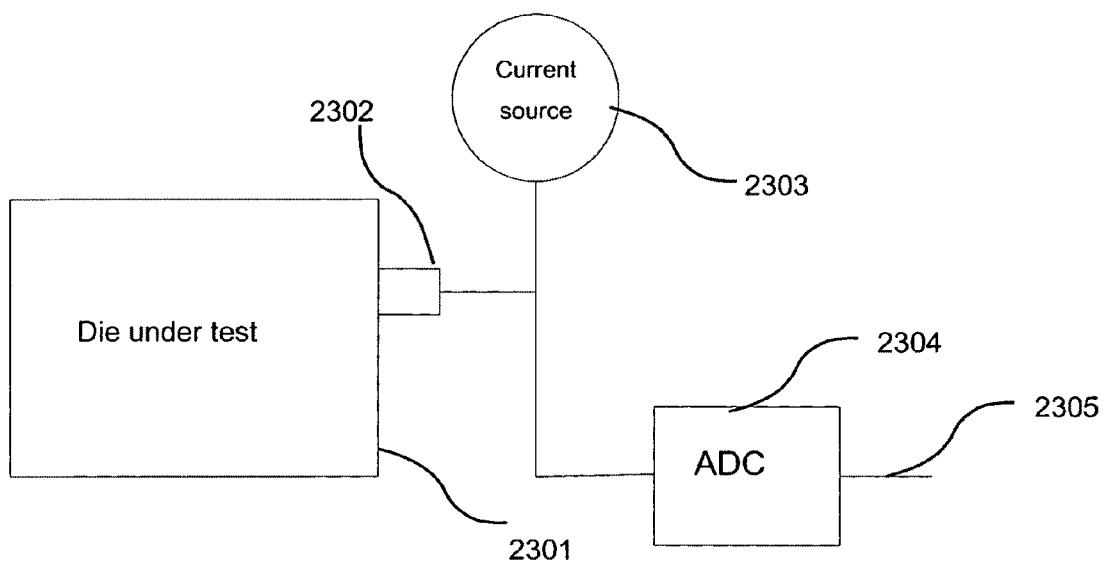
FIG. 23 illustrates an embodiment of DC characteristic test on a die under test.

FIG. 23 illustrates an embodiment of DC characteristic test on a die under test. In this embodiment, a current source 2303 is connected to a pad/solder ball 2302 on a die under test 2301. During the test, the current source 2303 drives a given amount of current to die 2301 through pad/solder ball 2302 to generate a voltage potential with respect to ground (GND). An analog to digital converter 2304 measures the voltage on the pad/solder ball 2302, and the DC characteristic meets the requirement or not can be determined by comparing the voltage value with a reference DC characteristic voltage value.

Figure 24:
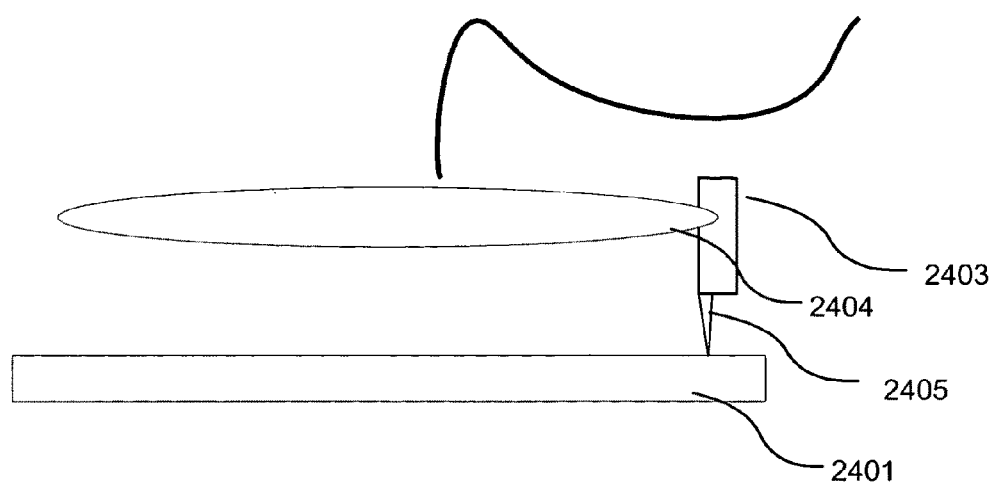
FIG. 24 illustrates an embodiment of test on CMOS image sensors.

FIG. 24 illustrates an embodiment of test on CMOS image sensors. The dice in wafer 2401 are CMOS image sensors in the embodiment. There is a light emitting device 2404 which emits light with different lum and chroma to part or even all CMOS image sensors on wafer. A probe 2405 of a special probe card 2403 which does not block the light path of the light emitting device 2404 is in contact with the pads of a CMOS sensor on wafer 2401. A plural number of the CMOS sensors can be tested in parallel through comparing the lum and chroma values outputted by different sensors to each other or comparing the lum and chroma values outputted by different sensors with the reference value, and passing the judgmental result to the probe 2405 on the probe card 2403 through output circuit.

FIG. 25 illustrates an embodiment of a wafer testing apparatus which is able to provide enough power supply current at a given voltage to a desired number of DUTs. Power supply apparatus 2501 is able to supply power to all DUTs at the same time for parallel testing. During test, the test simulation provided by the tester 2502 and the power supply provided by the power supply apparatus 2501 are passed in parallel to all the DUTs on the wafer under test 2504 through the probe 2505 and the testing interface 2503, to achieve testing of all dice in parallel. In this embodiment, the testing interface 2503 can be in the form of a wafer or a circuit board.

FIG. 26 illustrates an embodiment of a test result table used to store the test results of a plural number of function blocks within an integrated circuit chip. In test result table 2601, each cell 2602 stores the test status of a corresponding said function block, wherein "?" represents a block not yet test, "x" represents a block which failed the test, and "0" represents a block which passed the test. The test result table can be placed inside or outside of the IC-chips. Its storage medium may be volatile or non-volatile; can be write once only or write multiple times. Replacing the failed block with identical function redundant block can improve yield, keep system function correctly, and realize self-repair system.

Figure 27:
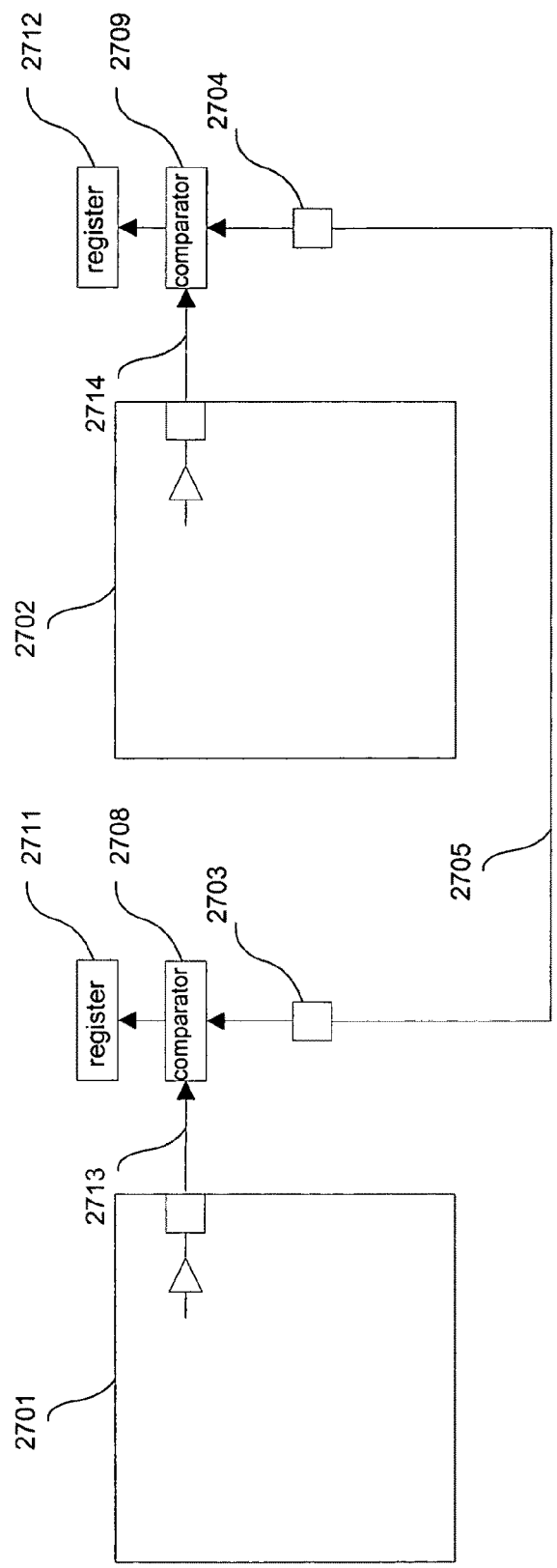
FIG. 27 illustrates an embodiment in which the DUT output is compared with expected results.

FIG. 27 illustrates an embodiment in which the DUT output is compared with expected results. Probe which carries expected operation result for dice 2701 and 2702 comes in contact with either probing pad 2703 or 2704 on the scribe line. The expected result is sent to both comparator 2708 and 2709 by way of wire 2705 and compared with output 2713 of die 2701 and output 2714 of die 2702. The respective compare/decision result is stored in registers 2711 and 2712.

FIG. 28 is a cross section view of wafer testing by using circuit boards. Circuit board 2801 is fixed on the wafer under test 2805 through the cramp 2803. Circuit board 2801 has a plural number of wiring channels 2807. In addition, the circuit board 2801 also has solder balls 2804, which are connected with the wiring channels 2807, whose position corresponds to all pads' position of the wafer under test 2805. The pressing device 2811 presses on the circuit board 2801 and makes solder balls 2804 to contact the pads tightly. Power supply and test stimulation are passed to the wafer under test 2805 through the test cable 2813, wiring channels 2807 and solder balls 2804 on the circuit board 2801. At the same time, testing apparatus receives testing results from the wafer under test 2805 through the test cable 2813, the wiring channels 2807 on the circuit board 2801 and solder balls 2804.

In this embodiment, the position of the solder ball 2804 on the circuit board 2801 can also be contacted to the pads of the wafer under test 2805, so that some of the inputs are passed through solder balls 2804 on the circuit board 2801, and the others are passed through the pads of other dice by the input path on the wafer under test 2805. Circuit board 2801 can also have pads which connect to the wiring channels 2807 instead of having solder balls 2804. In this case, the solder balls are bound to the wafer under test 2805, and the position of all or part of the pads on the circuit board 2801 are corresponding to the position of solder balls on the wafer under test 2805.

FIG. 29(a) illustrates an embodiment of a test on a packaged integrated circuit. There are a number of DUT 2902, a buffer and comparison chip 2903 and the interface 2904 which is used to communicate with the tester on testing circuit board 2901. DUT 2902 is connected to the circuit board through the socket, so that said DUT's input ports connect to the output ports of said buffer and comparison chip 2903; and the output ports of said DUT 2902 connect to the input ports of said buffer and comparison chip 2903, wherein said input ports receive the data for comparison; and the rest ports of said buffer and comparison chip 2903 connect to said interface 2904, to receive the testing stimulations and expected results.

The testing stimulations generated by tester are transmitted to said plural number of DUTs 2902 for testing purpose. The operation results generated by said DUTs 2092 are transmitted to the buffer and comparison chip 2903 to compare with the expected results received from said tester through said interface 2904. The comparison results are sent back to said tester through the interface 2904 as well, to determine whether said DUTs 2902 passed or not.

An improvement of this embodiment is that the two different sets of input ports receiving the operation results to be compared can also connect to the output ports of different DUTs, to compare the output data from one DUT with the other's. In this case, the possible failed unit can be determined without any expected result from said tester.

In this embodiment, the input testing stimulation applied on DUTs 2902 can also be transmitted by electromagnetic wave.

FIG. 29(b) illustrates another embodiment of test on a packaged integrated circuit. There are only a number of DUTs 2915 and electrical interface 2912 on the testing circuit board 2911. In another circuit board 2918, there are a number of buffer and comparison chips such as 2916, electrical interface 2914, and the input/output interface 2919 which are used to communicated with the tester. The entire testing apparatus is in the form that said large number of testing circuit boards such as 2911 connect to the circuit board 2918 through the electrical interface 2912, wherein the three-dimensional figure is shown in FIG. 29(c).

The input and output ports of said DUTs 2915 on the testing circuit board 2911 connect to the electrical interface 2912. The testing stimulations generated by said tester are transmitted to the DUTs 2915 through the input/output interface 2919, electrical interface 2914 and 2912; and the expected results generated by said tester are transmitted to the buffer and comparison chips such as 2916 through the input/output interface 2919. Said buffer and comparison chips such as 2919 compare the operation results generated by DUTs 2915 through electrical interface 2914 and 2912 with said expected results to determine whether said DUTs 2915 pass or not.

An improvement of this embodiment is that the buffer and comparison chip 2916 can also be used to compare the results form corresponding output ports of different DUTs. In this case, the possible failed unit can be determined without any expected result from said tester.

In this embodiment, the input testing stimulation applied on DUTs 2915 can also be transmitted by electromagnetic wave.

For better description, the tester and interconnection between each part are not shown in both embodiments in FIG. 29(a) and FIG. 29(b).

Although the foregoing invention has been described in some detail for purposes of clarity, it will be apparent that certain changes and modifications may be practiced within the scope of the appended claims. It should be noted that there are many alternative ways of implementing both the processes and apparatuses of the present invention. Accordingly, the present embodiments are to be considered as illustrative and not restrictive, and the invention is not to be limited to the details given herein, but may be modified within the scope and equivalents of the appended claims.

What is claimed is:

1. A method for testing a plurality of identical function microelectronic circuits on a common substrate, the method comprising:
    delivering a testing stimulation signal to a plurality of identical function devices under test (DUTs) in parallel on the common substrate through input paths on the common substrate;
    comparing outputs of the DUTs using a plurality of comparators on the common substrate; and
    testing input paths connected to the DUTs and output paths connected to the comparators, wherein said testing comprises:
    delivering a testing stimulation signal to the input paths;
    comparing an output of the DUTs with the input testing simulation signal;
    if the output matches the input, determining that the input paths and the output paths pass the test; and
    if the output does not match the input, determining that the input paths and the output paths fail the test.

2. The method of claim 1, wherein the DUTs receive the same testing stimulation.

3. The method of claim 1 further comprising determining whether a DUT fails according to a comparison output and determining a location of a failed DUT.

4. The method of claim 1, wherein the testing stimulation signal is delivered through electromagnetic waves.

5. The method of claim 1 further comprising delivering power to the DUTs through wire.

6. The method of claim 1 further comprising delivering power to the DUTs through electromagnetic waves.

7. A semiconductor wafer comprising:
    a plurality of identical function dice under test (DUTs); and
    a plurality of comparators each placed between the dice on the wafer,
    wherein each comparator includes at least two inputs, one connected to an output of one DUT, and the other connected to an output of another DUT.

8. A semiconductor wafer comprising:
    a plurality of identical function dice under test (DUTs); and
    a plurality of comparators each placed between the dice on the wafer,
    wherein the comparators are configured to compare output of a DUT with output of another DUT.

9. The semiconductor wafer of claim 8 further comprising a plurality of register circuits connected to the comparators.

10. The semiconductor wafer of claim 8, wherein the comparators are further configured to compare output of a DUT with a predetermined value.

11. The semiconductor wafer of claim 8 further comprising input paths connected to input of the plurality of dice.

12. The semiconductor wafer of claim 11, wherein the input paths are connected to the comparators.

13. The semiconductor wafer of claim 11, wherein the input paths include fixed wire or configurable switches, or a combination of fixed wire and configurable switches.

14. The semiconductor wafer of claim 8, wherein the comparators are positioned on scribe lines on the wafer, along which the wafer is to be cut to produce individual chips.

15. The semiconductor wafer of claim 8 further comprising output paths connected to the comparators.

16. The semiconductor wafer of claim 15, wherein the output paths include configurable switches.

17. The semiconductor wafer of claim 8 further comprising a test stimulation signal generator on the wafer.

18. The semiconductor wafer of claim 8 further comprising a compression circuit connected to the comparators.

19. A semiconductor wafer comprising:
    a plurality of identical function dice under test (DUTs);
    a plurality of comparators each placed between the dice on the wafer;
    output paths connected to the comparators, wherein the output paths include configurable switches.

20. The semiconductor wafer of claim 19 further comprising a plurality of register circuits connected to the comparators.

21. The semiconductor wafer of claim 19, wherein each comparator includes at least two inputs, one connected to an output of one DUT, and the other connected to an output of another DUT.

22. The semiconductor wafer of claim 19, wherein the comparators are positioned on scribe lines on the wafer, along which the wafer is to be cut to produce individual chips.

23. The semiconductor wafer of claim 19 further comprising a test stimulation signal generator on the wafer.

24. The semiconductor wafer of claim 19 further comprising a compression circuit connected to the comparators.

* * * * *